United States Patent
Van Kirk

(12) 
(10) Patent No.: US 6,968,485 B2
(45) Date of Patent: Nov. 22, 2005

(54) SIGNAL MEASUREMENT APPARATUS AND METHOD

(75) Inventor: Steve Van Kirk, Brooklyn Park, MN (US)

(73) Assignee: Micron Technology, Inc., Boise, ID (US)

( * ) Notice: Subject to any disclaimer, the term of this patent is extended or adjusted under 35 U.S.C. 154(b) by 744 days.

(21) Appl. No.: 09/945,309

(22) Filed: Aug. 30, 2001

(65) Prior Publication Data
US 2003/0042925 A1 Mar. 6, 2003

(51) Int. Cl.$^7$ .............................................. G01R 31/28
(52) U.S. Cl. ..................... 714/724; 714/726; 324/765
(58) Field of Search .............................. 714/724, 725, 714/726, 727, 718, 734; 324/765, 763; 365/200, 201, 207

(56) References Cited

U.S. PATENT DOCUMENTS

| | | | |
|---|---|---|---|
| 4,594,677 A | 6/1986 | Barlow | 364/578 |
| 5,477,160 A | 12/1995 | Love | 324/755 |
| 5,498,972 A * | 3/1996 | Haulin | 324/765 |
| 5,566,083 A | 10/1996 | Fang | 364/489 |
| 6,000,050 A | 12/1999 | Komoda et al. | 714/724 |
| 6,195,613 B1 * | 2/2001 | Roy et al. | 702/65 |

OTHER PUBLICATIONS

Barr, A.W., "Analyzing Crosstalk and Ground Bounce in Multiconductor Systems Using SPICE Circuit Simulations", *AMP Journal of Technology*, vol. 3, (Nov. 1993), pp. 10–20.

* cited by examiner

*Primary Examiner*—Albert Decady
*Assistant Examiner*—James Kerveros
(74) *Attorney, Agent, or Firm*—Schwegman, Lundberg, Woessner & Kluth, P.A.

(57) ABSTRACT

Ground bounce measurement circuitry, integrated circuit packaging, memory circuit modules, circuit cards, and systems, and methods to form, assemble, and use them are provided. A circuit combination is disclosed which includes an integrated circuit and measurement circuit, constructed so that each may be supported by a single substrate, or enclosed within a single integrated circuit package. The integrated circuit includes a test domain having a test voltage, and a reference domain having a reference voltage. The measurement circuit is operatively connected to the reference domain and the test domain to measure the ground bounce voltage, which is the difference between the test voltage and the reference voltage. The measured value of the ground bounce voltage can then be acquired by a data acquisition system, or made immediately available for observation using instrumentation outside of the substrate or integrated circuit package environment.

46 Claims, 12 Drawing Sheets

US 6,968,485 B2

SIGNAL MEASUREMENT APPARATUS AND METHOD

TECHNICAL FIELD OF THE INVENTION

This invention relates generally to determining the character of various undesired signals which operate to interfere with the flow of desired signals into and out of packaged, or integrated, circuits. More particularly, the invention relates to various apparatus, methods, and systems which can be used to characterize such undesired signals resulting from the presence of physical structures within integrated circuit packages, such as lead bonding wires.

BACKGROUND OF THE INVENTION

Steady advances in integrated circuit technology have fueled the last 30 years of increasingly rapid progress with regard to the speed and complexity of signal processing circuitry design. In the past, system processing speed was determined by gate and register performance. Thus, to increase the speed and power of a particular circuit, one might simply select faster, more complex, and even less expensive integrated circuits.

Given these circumstances, analog circuit design issues, such as crosstalk, phase distortion, amplitude distortion, reflections, ringing, and ground bounce could be safely ignored. At worst, such events were treated as minor irritants, since they rarely arose. This was the case because synchronous digital logic is fairly forgiving with regard to amplitude and timing variations, especially at slow clock speeds. Times and circumstances have changed. At current operational design speeds, analog circuit characteristics play a strong, if not dominating role in determining overall digital system performance.

Integrated circuit packaging also affects high speed performance. Almost all packages, when used at high speed, suffer from problems with lead inductance and lead capacitance. The inductance of individual leads in a device package creates a problem called ground bounce. This phenomenon causes glitches to arise in logic inputs whenever the device outputs switch from one state to another, especially if they are subjected to heavy capacitive loading. The magnitude of the glitches, and the effects they have, are a subject of concern to the high speed circuit designer.

Ground bounce has become such a problem that many articles have been written about the subject, and various approaches have been taken to model its occurrence. See, for example, *Analyzing Crosstalk and Ground Bounce in Multiconductor Systems Using SPICE Circuit Simulations* by A. W. Barr, published in the AMP Journal of Technology, Vol. 3, November 1993.

To understand how ground bounce occurs, reference is now made to FIG. 1, in which is shown a prior art schematic view of an idealized logic die, wire-bonded to four leads of an integrated circuit package. One transmit circuit 150 and one receive circuit 145 are also illustrated. The transmit circuit 150 shown includes a totem-pole output stage, although any configuration may exhibit the same problem as described above at high operational speeds.

Assume that the capacitor 155 is charged, and that the lower output driver switch closes, discharging the capacitor 155 to ground 130. As the voltage across the capacitor 155 falls, the stored charge flows back to the ground 130, causing a massive current surge to flow around the ground loop shown as $I_{discharge}$. As the current $I_{discharge}$ builds and then recedes, changes in the current $I_{discharge}$, flowing through the inductance Lgnd 125 of the ground pin 120, induce a voltage Vgnd between the system ground plane 130 underneath the device 110 and the internal package ground domain 135. The magnitude of this voltage is: $Vgnd=Lgnd*(d/dt)I_{discharge}$. It is the shift in this internal ground reference voltage Vgnd due to output switching that is called "ground bounce."

The ground bounce voltage Vgnd is usually small compared to the full-swing output voltage across the load 155. While the voltage Vgnd typically does not act to significantly impair the transmitted signal from the driver, it can interfere in a major way with signal reception.

Consider the receiver section 145 of the same die. The receiver 140 shown differentially compares the input voltage against its local internal ground reference. This differencing operation appears in FIG. 1 as a plus (+) input connected to the Vin lead 115 and a minus (−) input connected to the internal ground domain 135. Because the internal ground domain 135 carries the Vgnd noise pulse, the actual differential voltage seen by the input circuit is equal to: Vactual= Vin−Vgnd.

Because the input circuit receiver 140 responds to the difference between the plus (+) and minus (−) inputs, there is no way to know whether the noise pulse Vgnd has been added to the minus (−) input, or subtracted from the plus (+) input. In other words, the Vgnd pulse voltage appears to the input circuitry 145 as if it were noise superimposed directly on the desired input signal, Vin. Moreover, if N outputs are simultaneously switched from an integrated circuit chip package into N corresponding capacitive loads, the amount of ground current will be increased by N times, and the magnitude of the Vgnd pulse will be increased accordingly.

The magnitude of the ground bounce voltage Vgnd is proportional to the rate of change of the magnitude of current passing through the ground pin 120. When capacitive loads are driven, the rate of change in the current appears as the second derivative of the voltage, which is typically described as a double-humped waveform, or a single sine-wave cycle, first bumping up, and then bumping down.

Ground bounce voltages can affect circuits in many significant ways. For example, referring now to FIG. 2A, a prior art view of a typical TTL address driver circuit can be seen. The circuit 205 includes a TTL octal D flip-flop 210, with a single clock input 230 driving an address bus 220 connected to a bank of memory chips 225. If there are 32 memory chips in the bank 225, and each memory chip in the bank 225 presents a 5 pF capacitive load at each address input, then each address line will see a total capacitive loading of about 160 pF.

FIG. 2B illustrates the operational effect of the circuit in FIG. 2A. Assume that data arrives at the data input 215 with plenty of setup time 282 but with little hold time 284. For example, as shown in FIG. 2B, illustrating a prior art view of ground bounce activity and its effect on the typical circuit illustrated in FIG. 2A, the data may arrive at the input 215 with a 3-ns setup time 282 and a 1-ns hold time 284. On the first rising clock edge 292 the flip-flop 210 latches the data input 252 word "FF" 254. At the second rising clock edge 294 the flip-flop 210 latches the data input 252 word "00" 256. In each case, the flip-flop propagation delay 280 of 3-ns is slightly longer than the required hold time 284. As the input data 258 changes to some other pattern at time 296, which follows 1-ns after the second rising clock edge 294, the flip-flop 210 has internally latched the "00" data word 256, but the outputs 272 have not yet switched from "FF" 272 to "00" 274.

The Vgnd trace 262 demonstrates that after the first rising clock edge 292, when the outputs 250 switch to a positive value 272, charging current flows in the power pin of the flip-flop 210, and not into the ground pin, so little noise appears on the trace 262 at point 269. However, at time 298, as all eight outputs swing to a LOW value 274, a large noise pulse 266 appears on the Vgnd trace 262. This noise pulse 266 causes an error known as double-clocking within the flip-flop 210, and is well known to those skilled in the art.

Double-clocking results from differential input action in the clock circuit of the flip-flop 210, which measures the voltage difference between the chip's clock pin 230 and its ground pin. The Clock–Vgnd voltage difference trace 264 of FIG. 2B shows this difference, which is representative of TTL circuits. CMOS circuits tend to compare inputs against a weighted average of Vcc (i.e., the operational supply voltage) and ground, while other logic families simply compare inputs against Vcc. However, in each case, the same problems arise, albeit with slightly different topologies.

The difference trace 264 waveform shows a clean clock edge 261 at the time of the first rising edge 292 of the clock waveform 260, followed by a glitch 268 induced by signal currents flowing into the flip-flop 210 ground pin. The glitch 268 will cause the flip-flop to re-clock; if the data input 215 has changed by the time the glitch 268 occurs, the flip-flop 210 will proceed directly to the unknown state "XX" 276. The outputs 250 at this point in time will momentarily flip to the correct state "00" 274, and then mysteriously flop to the unknown (incorrect) condition "XX" 276. The problem is compounded because external observations of the clock input 230 will typically reveal a perfectly clean signal. It is only by viewing internal logic package signals that one may locate the problem.

Double-clocking errors typically occur within dual-inline flip-flop packages that have fast output drivers connected to heavy capacitive loads. Edge-sensitive input lines, such as resets and interrupt service lines, are particularly susceptible to ground bounce glitches.

Thus, given the ever-increasing clock speeds used in current designs, there is a need in the art to characterize ground bounce signals, both as to their magnitude and shape. Referring now to FIG. 3, a prior art view of a system to measure ground bounce voltage with respect to an integrated circuit package can be seen. In this case, the system 300 is set up to attempt measurement of the ground bounce voltage Vgnd for a quad flip-flop 310, such as a 74HC174 flip-flop, which is configured so that three of the outputs 370 are toggled between HIGH and LOW values, while the fourth output 380 is fixed at a LOW value. Capacitive loads 360 can thus be applied to any of the three active outputs 370. This prior art arrangement can therefore be used to measure ground bounce voltage Vgnd with a variety of loads.

Because the inactive fourth output 380 is fixed at a logic LOW value, it can serve as a crude window into the chip 310 through which the internal ground voltage may be measured. The clock 340 and asynchronous reset 350 lines are used to alternately set and reset the three active outputs 370, in a manner well known to those skilled in the art.

With all three capacitive loads 360 connected (assume a value of 20 pF per load), the magnitude of the ground bounce voltage Vgnd 397, as measured using a probe 390 on the inactive output 380, and viewed on an oscilloscope 395, is about 150 mV. While this may seem not very significant, consider that the low-side voltage margin on some types of High-Speed Complementary Metal Oxide Semiconductor (HCT) logic is only about 470 mV. If, for example, eight simultaneous outputs were switching, the magnitude of the pulse 397 would be larger by a factor of 8/3, reaching a value of 400 mV. Moreover, the magnitude of Vgnd reduces the available residual noise margin which might be used to compensate for other noise and signal distortion effects.

Thus, as circuit clock speeds increase, there is an increasing need to characterize the magnitude and shape of the ground bounce voltage. However, integrated circuit packages do not always lend themselves to the prior art testing methods previously described. Such methods are error-prone, introducing inductance and capacitance via the probes required to make the measurement, as well as being susceptible to the proximity of other signals outside of the chip whose performance is being scrutinized. Moreover, the package itself introduces errors due to parasitic capacitance, such that measurements taken outside of the package differ from what truly exists on the surface of the die. These considerations give rise to a need in the art for improved apparatus, systems, and methods of measuring the magnitude and shape of the ground bounce voltage under various conditions. Such apparatus, systems, and methods should obviate the need for external measurement circuitry, probes, and test apparatus, if possible, and consistently improve the accuracy of ground bounce voltage characterization measurements.

SUMMARY OF THE INVENTION

The above mentioned problems with characterizing and measuring ground bounce for a particular circuit are addressed by the present invention and will be understood by reading and studying the following specification. Systems, devices, and methods are presented for developing and using circuits which obviate the need for costly, inconvenient, and inaccurate external ground bounce measurement equipment and test fixtures.

In essence, one embodiment of the invention disclosed herein includes a ground bounce measurement circuit formed upon the same substrate as the circuit to be tested. The ground bounce measurement circuit is operatively connected to a test domain within the circuit to be tested, as well as a reference domain (also typically an integral part of the circuit to be tested). To make the measurement, a power supply is connected to the circuit to be tested so as to develop test and reference voltages within the test and reference domains, respectively. The ground bounce measurement circuit then measures the voltage difference between the domains as the circuit to be tested operates. This difference, which is the ground bounce voltage, may optionally be recorded by the measurement circuitry.

In another embodiment of the present invention, a semiconductor die is provided. The die includes an integrated circuit (e.g., the circuit to be tested) supported by a substrate. The integrated circuit includes the test domain, wherein the test voltage is generated, and the reference domain, wherein the reference voltage is generated. The die also includes a measurement circuit (i.e., the ground bounce measurement circuit) supported by the same substrate. The measurement circuit is connected to the test and reference domains to measure the difference between the test and reference voltages. Some embodiments of the invention may include the selection of various ground or power connections within the integrated circuit to function as the test and reference domains.

The integrated circuit may include a switching logic circuit as a further aid to testing and measuring ground bounce voltages as various loads are applied to the integrated circuit. The measurement circuit may include a peak detector, a comparison circuit, and/or an analog-to-digital converter, or even a complete data acquisition system to assist in making measurements of ground bounce voltages.

Another embodiment of the invention includes an integrated circuit package, including leads connected to the substrate which supports the integrated circuit and measurement circuit. The integrated circuit may include a processor, a memory array, or an output driver connected to the test domain.

The invention may also be described as a circuit board comprising one or more integrated circuit packages constructed according to the teachings of the invention, including, for example, a memory circuit module with a plurality of memory integrated circuit packages, wherein one or more of the packages includes the integrated circuit and measurement circuit described above. Thus, the invention may also be described as a computer system that has a processor circuit card, including one or more of such memory circuit modules.

Yet another embodiment of the invention includes a ground bounce measurement system having the integrated circuit and measurement circuit formed on the same substrate, as described above, wherein the measurement circuit further includes a data acquisition system for acquiring the ground bounce voltage measurement. One or more differential voltage values can be acquired, and may be retrieved using a number of conventional methods, such as by using a computer terminal.

Other embodiments of the invention include various methods used to form and assemble the dice, circuit packages, modules, and systems described herein. Further embodiments of the invention include methods to conduct ground bounce voltage measurements using the dice, circuit packages, modules, and systems disclosed.

These and other embodiments, aspects, advantages, and features of the present invention, as well as various methods for producing, forming, and assembling the devices, circuitry, apparatus, and systems described, will be set forth in the detailed description which follows. Other aspects and features will also become apparent to those skilled in the art after due study of the drawings included herein, and a review of the detailed description, as well as by the practice of the invention. Such aspects, advantages, and features of the invention are realized and attained by exercising the instrumentalities, procedures, and combinations particularly pointed out in the appended claims.

DETAILED DESCRIPTION OF THE INVENTION

Figure 1:
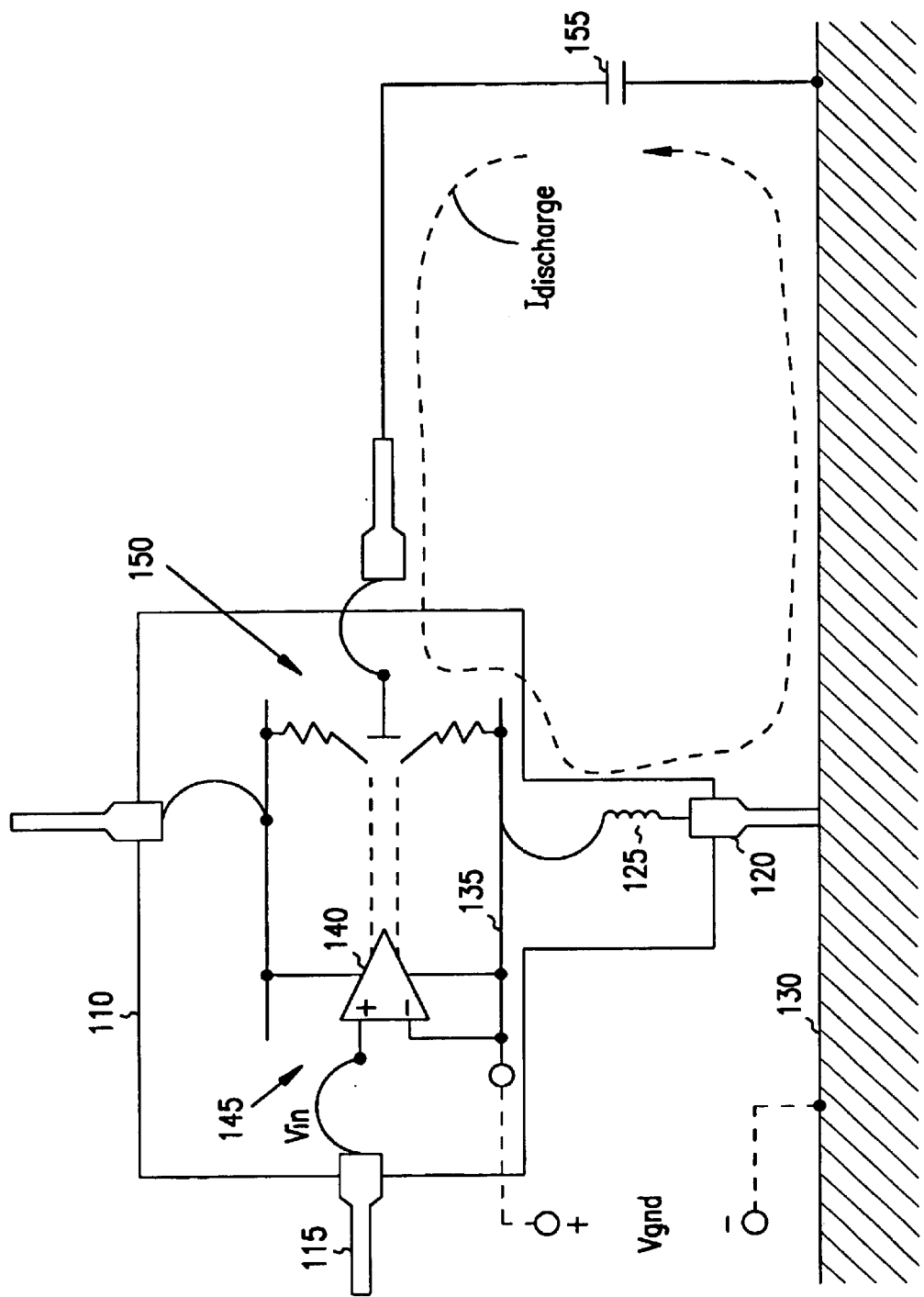
FIG. 1, previously described, is a prior art schematic view of an idealized logic die, wire-bonded to four leads of an integrated circuit package.
Figure 2A:
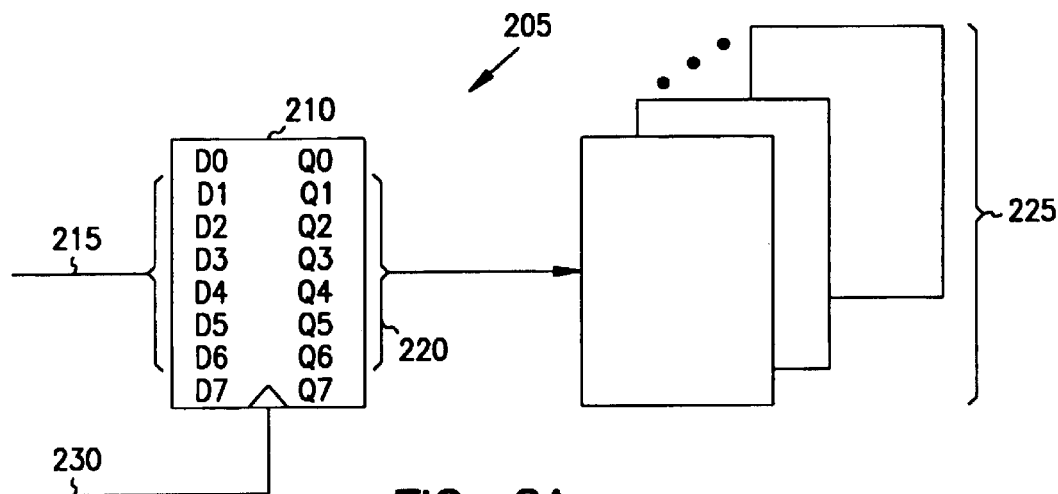
FIG. 2A, previously described, is a prior art view of a typical TTL address driver circuit.
Figure 2B:
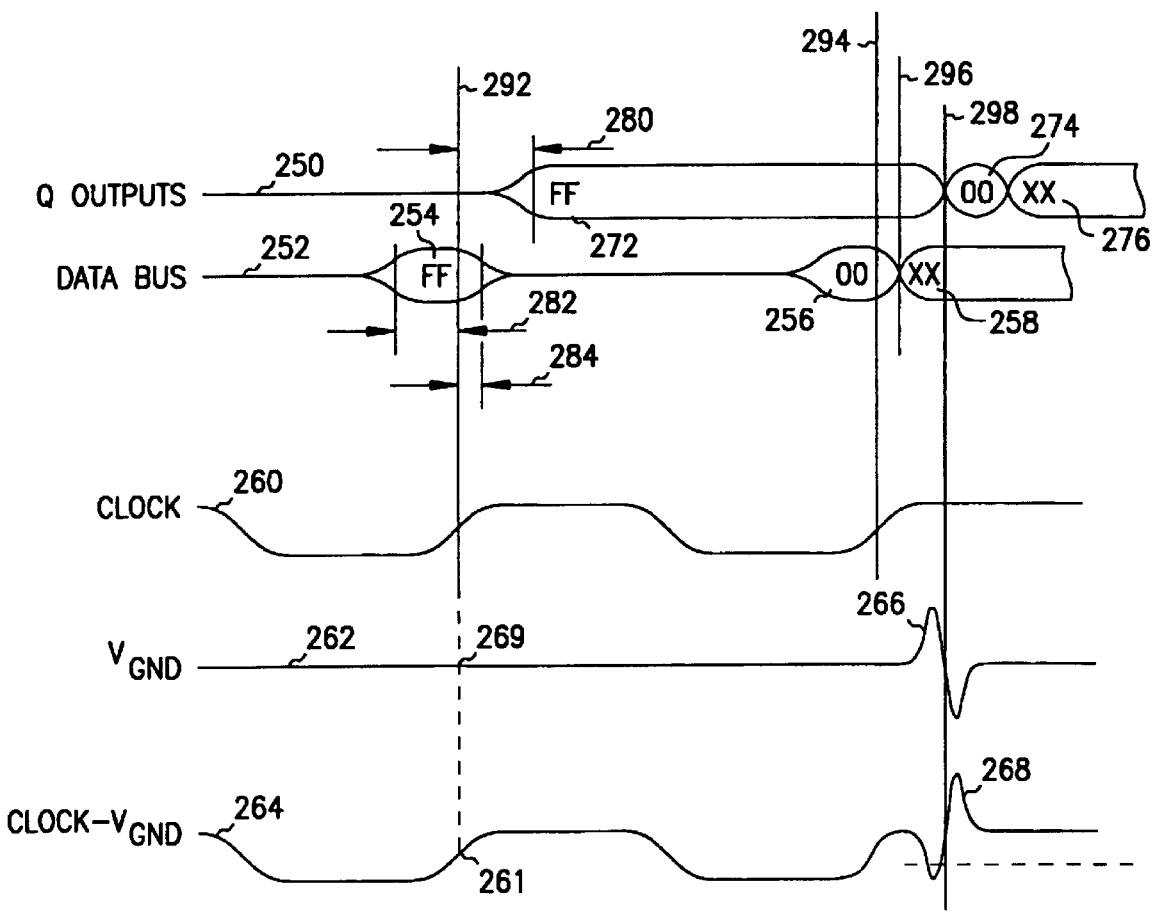
FIG. 2B, previously described, is a prior art view of ground bounce activity and its effect on the typical circuit illustrated in FIG. 2A.

In the following detailed description of the invention, reference is made to the accompanying drawings which form a part hereof, in which are shown, by way of illustration, and not limitation, specific embodiments by which the invention may be practiced. In the drawings, like numerals describe substantially similar components throughout the several views. The embodiments illustrated are described in sufficient detail to enable those skilled in the art to practice the invention. Other embodiments may be utilized and derived therefrom, such that structural, logical, and electrical circuit substitutions and changes may be made without departing from the scope of the present invention.

Figure 3:
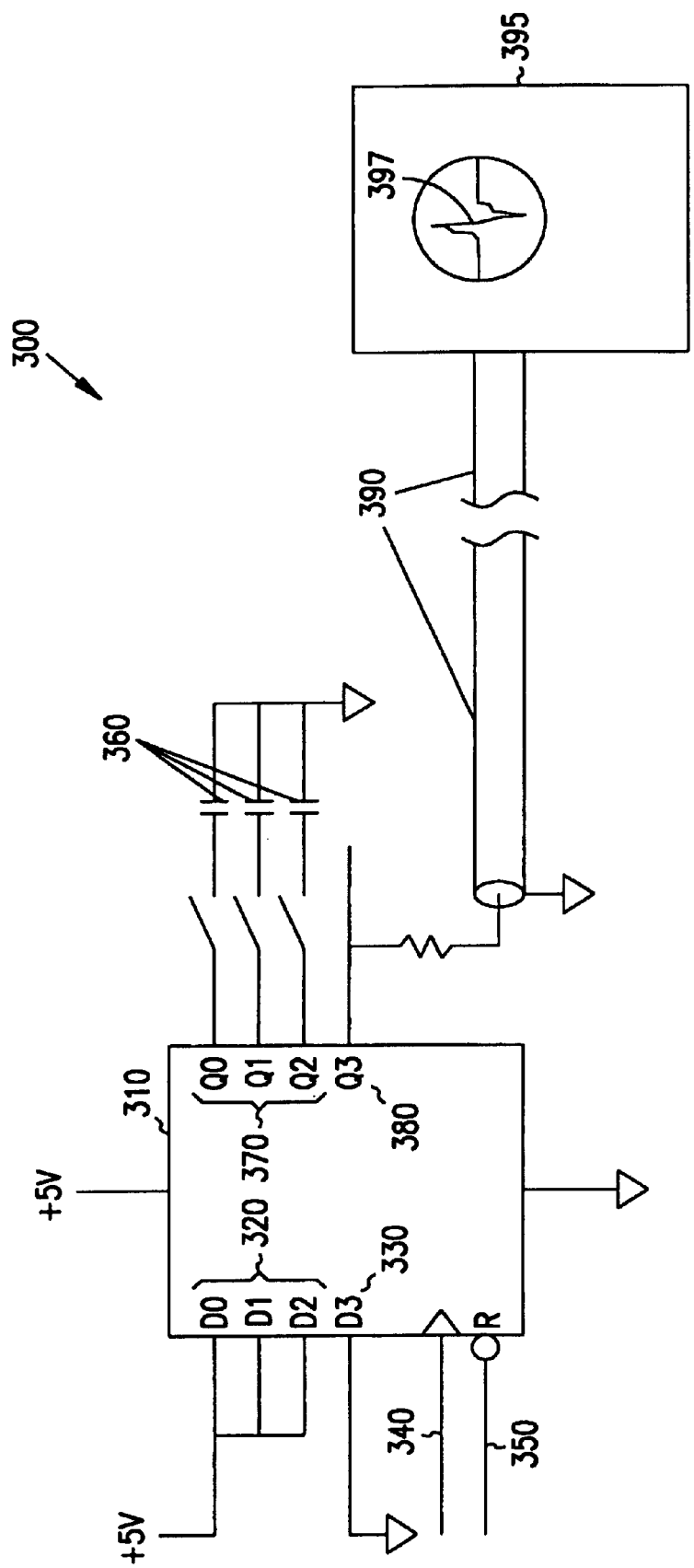
FIG. 3, previously described, is a prior art view of a system to measure ground bounce voltage with respect to an integrated circuit package.

The term "ground bounce voltage" as used in the following description may be understood to include, but is not limited to, the voltage difference between a test voltage developed in a selected test domain in a circuit, and a reference voltage developed in a selected reference domain of the same circuit, as the circuit operates, either in a random fashion, or as it executes some preselected sequence of activity, such as the switching of capacitively loaded outputs described for the prior art test method of FIG. 3, above. Throughout the discussion that follows, wherever applicable and appropriate, the ground bounce voltage measurement should be considered as a measurement of the instantaneous value of the difference between the selected domains, the value of the difference between the domains as a series of sampled values, and/or the value of the difference between the domains as a continuous analog voltage which varies over time. The following detailed description is, therefore, not to be taken in a limiting sense, and the scope of the present invention is defined only by the appended claims, along with the full range of equivalents to which such claims are entitled.

According to the teachings of the present invention, a circuit combination is described which includes, at a minimum, an integrated circuit co-located with a measurement circuit, such as may be supported by a single substrate or die, for example, or enclosed within a single integrated circuit package. The integrated circuit includes a test domain having a test voltage, and a reference domain having a reference voltage. The measurement circuit is operatively connected to the reference domain and the test domain to measure the difference between the test voltage and the reference voltage, that is, the ground bounce voltage, which can then be made available to other instrumentation outside of the substrate or integrated circuit package environment.

Figure 4:
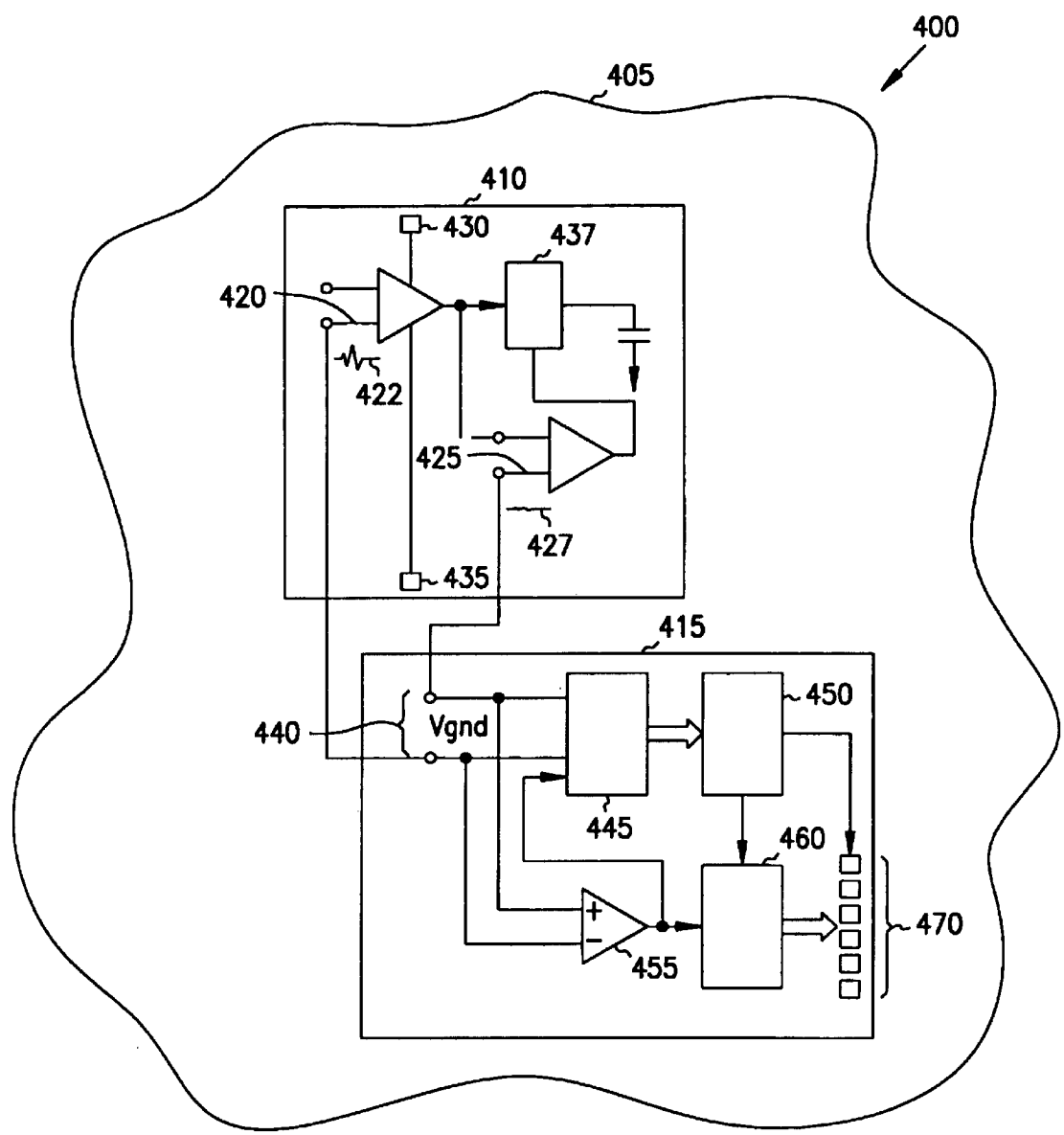
FIG. 4 is a schematic block diagram view of the invention as it might be embodied in a semiconductor die.

Referring now to FIG. 4, a schematic block diagram view of the invention as it might be embodied in a semiconductor die can be seen. The semiconductor die 400 includes a substrate 405 which supports an integrated circuit 410, along with a measurement circuit 415. The integrated circuit 410 includes a circuit, which may be any number of common circuits known to those skilled in the art, such as a memory array, a central processing unit, other digital circuitry, a digital-to-analog converter, and/or similar mixed-signal circuitry, or a combination of these, wherein the designer or user of the integrated circuit 410 would like to characterize the ground bounce voltage under various operational scenarios.

The integrated circuit 410, supported by the substrate 405, includes a test domain 420 and a reference domain 425. When power is applied to the supply pins 430 and 435, which may represent a positive supply pin 430 and a negative supply pin 435, or a ground pin 435, for example, and the integrated circuit 410 begins to operate, a test voltage 422 develops in the test domain 420 and a reference voltage 427 develops in the reference domain 425. For example, the test domain may constitute one of several internal ground or power references where it is important to determine the magnitude of the ground bounce effect, and the reference domain may be selected as a relatively "quiet" ground connection within the integrated circuit which could not normally be accessed by a user of the integrated circuit 410. As the circuit 410 operates, the test voltage 422 and the reference voltage 427 will fluctuate, and the difference between them, or the ground bounce voltage Vgnd, will be developed across the input 440 to the measurement circuit 415, since the measurement circuit 415 is operationally connected to the test and reference domains, 420 and 425, respectively.

To obtain the most useful measurement of the ground bounce voltage Vgnd, there are at least two different methods which may be employed with regard to operating the integrated circuit 410 while such measurements are taken. The first involves the application of power to the supply terminals 430, 435 of the integrated circuit 410, and allowing the circuit 410 to operate in the ordinary fashion. That is, over some period of time, the circuit 410 is employed in the typical manner, with whatever loading may be applied to it due to external connections required for normal operation. This method of measuring Vgnd is most useful with regard to characterizing the performance of a product having a fixed design, where comparisons will be made to subsequently manufactured units as part of a quality control system, for example.

The second method of measuring the voltage Vgnd involves the application of power to the supply terminals 430, 435 of the integrated circuit 410, as above, and then operating the circuit 410 in a predetermined manner. For example, if the integrated circuit 410 is a microprocessor, the predetermined course of activity may include executing a fixed number of memory write or peripheral access operations during the testing time period. If the integrated circuit 410 is a memory, then the predetermined course of activity may include executing a specified number of memory read operations during the testing time period. To this end, the integrated circuit 410 may even be formed to include one or more switching logic circuits 437 which can be exercised, or toggled through various states, in order to apply a predetermined amount of loading to the integrated circuit 410 to test the behavior of the voltage Vgnd under various conditions. In each case, the second testing mode makes use of a selected set of operations which are undertaken by the integrated circuit so that the instantaneous, serial, or continuous value of Vgnd can be readily and repeatedly observed for comparison to some absolute standard. This method is most useful when some ultimate level of performance is desired for the integrated circuit 410, and the Vgnd measurement is made to determine whether that performance level has indeed been reached.

After the voltage difference Vgnd is presented to the measurement circuit input 440, several possibilities exist with regard to measurement and further processing. For example, the measurement circuit 415 may include a comparison circuit 445, which provides a differential value to an analog-to-digital converter 450. The resulting digital signal value may then be sent directly to one or more output terminals 470 for access by the operator or designer of the integrated circuit 410. Alternatively, the measurement circuit may include an analog-to-digital converter 445 which feeds into a digital-to-analog converter 450. Then, the resulting analog signal can be sent directly to one or more output terminals 470 for access by the operator of the integrated circuit 410. In either case, several advantages are readily obtained by making use of the circuitry and methods of the present invention. First, accuracy is increased because measurements are made directly on-chip, without the added parasitic inductance and capacitance introduced by off-chip probing of a surrounding integrated circuit package. Second, measurement of the voltage Vgnd can be carried out without the need for special external equipment, since the analog parameters of the circuit 410 can be characterized during manufacture, and external measurement equipment probes can be further isolated from the measurement apparatus (e.g., using the analog-to-digital converter and digital-to-analog converter pair 445, 450). Third, attempts to measure the ground bounce voltage Vgnd should also be more accurate because the measurement is made by accessing test and reference domains selected and characterized during the manufacturing process, instead of whatever circuit domains happen to be connected to the circuit package leads.

As an example of further variety available within the measurement circuitry 415, it should be noted that a peak detector 455 may also be included. The output of the peak detector 455 may be provided to an analog-to-digital converter 445, directly to the outputs 470, or even to some form of data acquisition system 460, as are well known to those skilled in the art. Thus one or more values for Vgnd as measured by the measurement circuit 415 may be presented continuously at the outputs 470, or acquired by the data acquisition circuit 460 for later readout by a computer terminal.

While the use of an analog-to-digital converter, digital-to-analog converter pair 445, 450, and/or a peak detector 455, and/or a comparison circuit—analog-to-digital converter pair 445, 450 have been discussed, as shown in FIG. 4, there is no real limit to the number of devices and circuits which may be formed and used within the measurement circuit 415 to measure the magnitude and/or wave shape of the voltage Vgnd. For example, as part of its makeup, the measurement circuit 415 may include a simple sample and hold circuit, a complete programmable data acquisition system, a combination of the two, or any other type of circuitry used to measure difference signals similar to or identical to Vgnd, as is well known to those skilled in the art.

Figure 5:
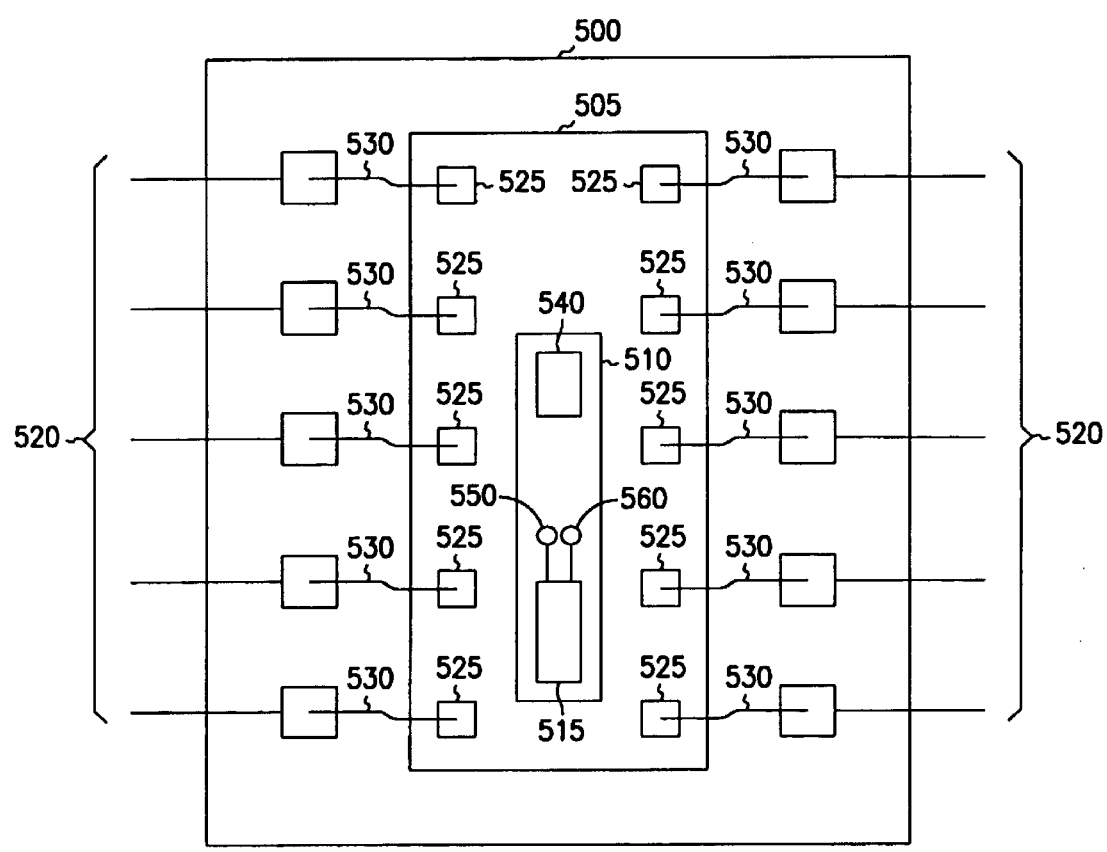
FIG. 5 is a schematic block diagram view of the invention as it might be embodied in an integrated circuit package.

Referring now to FIG. 5, a schematic block diagram view of the invention as it might be embodied in an integrated circuit package can be seen. The integrated circuit package 500, formed according to the teachings of the present invention, includes a plurality of leads 520, such as through-hole DIP package leads, and/or J-leads, or other types of leads or pads which lend themselves to surface mount assembly. The integrated circuit package 500 may include a substrate 505 which is electrically connected to the plurality of leads 520, via a plurality of bonding pads 525, by a corresponding plurality of wire bonds 530. As described above, the substrate 505 supports an integrated circuit 510, which includes a test domain and a reference domain in which the corresponding test and reference voltages can be developed. It should be noted that while wire bond connections are illustrated and described herein, the present invention includes many other packaging schemes, such as flip-chips, tape bonding, etc. Thus, wire bonding is merely to be taken as a well-known and easily understood example, and not by way of limitation.

As illustrated in FIG. 5, and as a slight variation on the construction of the integrated circuit 410 and measurement circuit 415 shown in FIG. 4 (wherein the circuits 410, 415 are illustrated as distinct circuits, fabricated separate and apart from each other), the teachings of the present invention also include construction of the measurement circuit as a sub-part or element of the integrated circuit itself. Thus, the measurement circuit 515, which is formed as a part of the integrated circuit 510, is also supported by the substrate 505, and operatively connected to the reference domain 550 and the test domain 560 to measure the difference between the test and reference voltages, respectively, developed therein.

As previously described, the test domain 560 may be selected to be one of several internal ground or power references where it is important to determine the magnitude of the ground bounce effect, and the reference domain may be selected as a relatively "quiet" ground connection within the integrated circuit which would not otherwise normally be accessible to a user of the integrated circuit package 500.

The integrated circuit package 500 may include a processor 540 connected to the test domain 550, for example, or a memory array 540 connected to the test domain 550. More likely, as an aid to characterizing ground bounce voltage behavior under severe conditions, the integrated circuit package 500 may include an output driver or special switching logic circuitry 540 connected to the test domain 550. In each case, inclusion of special testing circuitry within the integrated circuit 510, and selection of the test and reference domains 550 and 560, will depend heavily on the typical operational environment of the integrated circuit package 500 and the specific type of operational circuitry 510 which is formed on the substrate 505.

Figure 6:
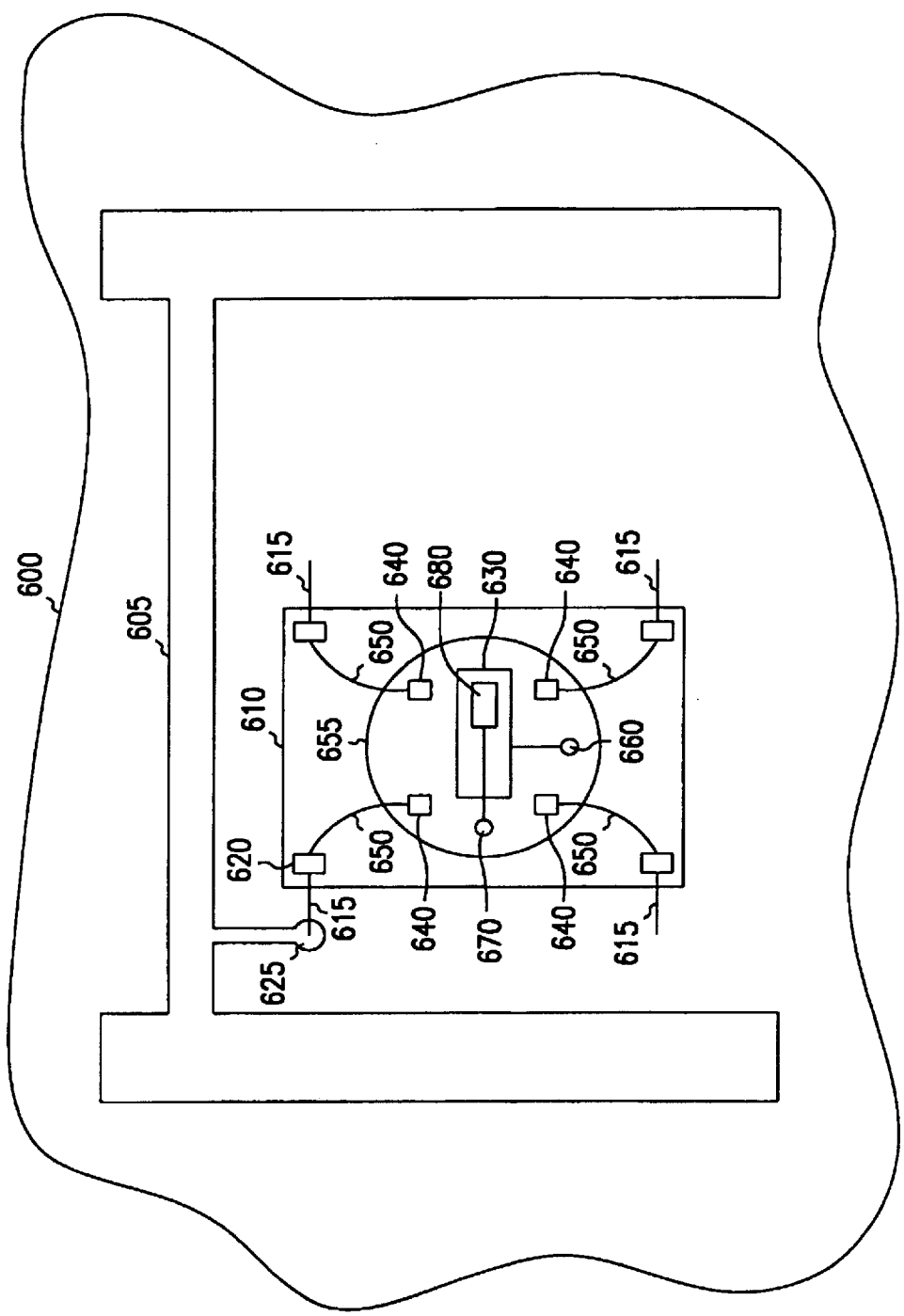
FIG. 6 is a schematic block diagram view of the invention as it might be embodied in a circuit board.

Referring now to FIG. 6, a schematic block diagram view of the invention as it might be embodied in a circuit board can be seen. Thus, a circuit board 600 assembled according to the teachings of the present invention may include a conductive layer 605, such as a surface mount conductive copper trace layer, connected to one or more integrated circuit packages 610. Each of the integrated circuit packages 610, in turn, may include a plurality of leads 615, wherein at least one of the leads 620 is connected to the conductive layer 605, using a through-hole via, or surface mounting pad 625, for example. The integrated circuit package includes a substrate 655 which has bonding pads 640 electrically connected to the leads 615 by wire bonds 650, as described above. The substrate 655, in turn, supports an integrated circuit 630 which includes a test domain 670 and a reference domain 660. The integrated circuit 630 may be fabricated apart from, or be fabricated to include the measurement circuit 680, also supported by the substrate. Again, the measurement circuit is operatively connected to the reference domain 660 and the test domain 670 to measure the difference between the test and reference voltages developed therein.

As previously described, the test domain 670 may be selected to be one of several internal ground or power references of the integrated circuit 630, where it is important to determine the magnitude of the ground bounce effect, and the reference domain 660 may be selected as a relatively "quiet" ground connection within the integrated circuit 630 which would not otherwise normally be accessible to a user of the circuit board 600. As previously described, the integrated circuit 630 may include a processor connected to the test domain 670, or a memory array connected to the test domain 670. In addition, the integrated circuit 630 may include an output driver or special switching logic connected to the test domain 670.

Figure 7:
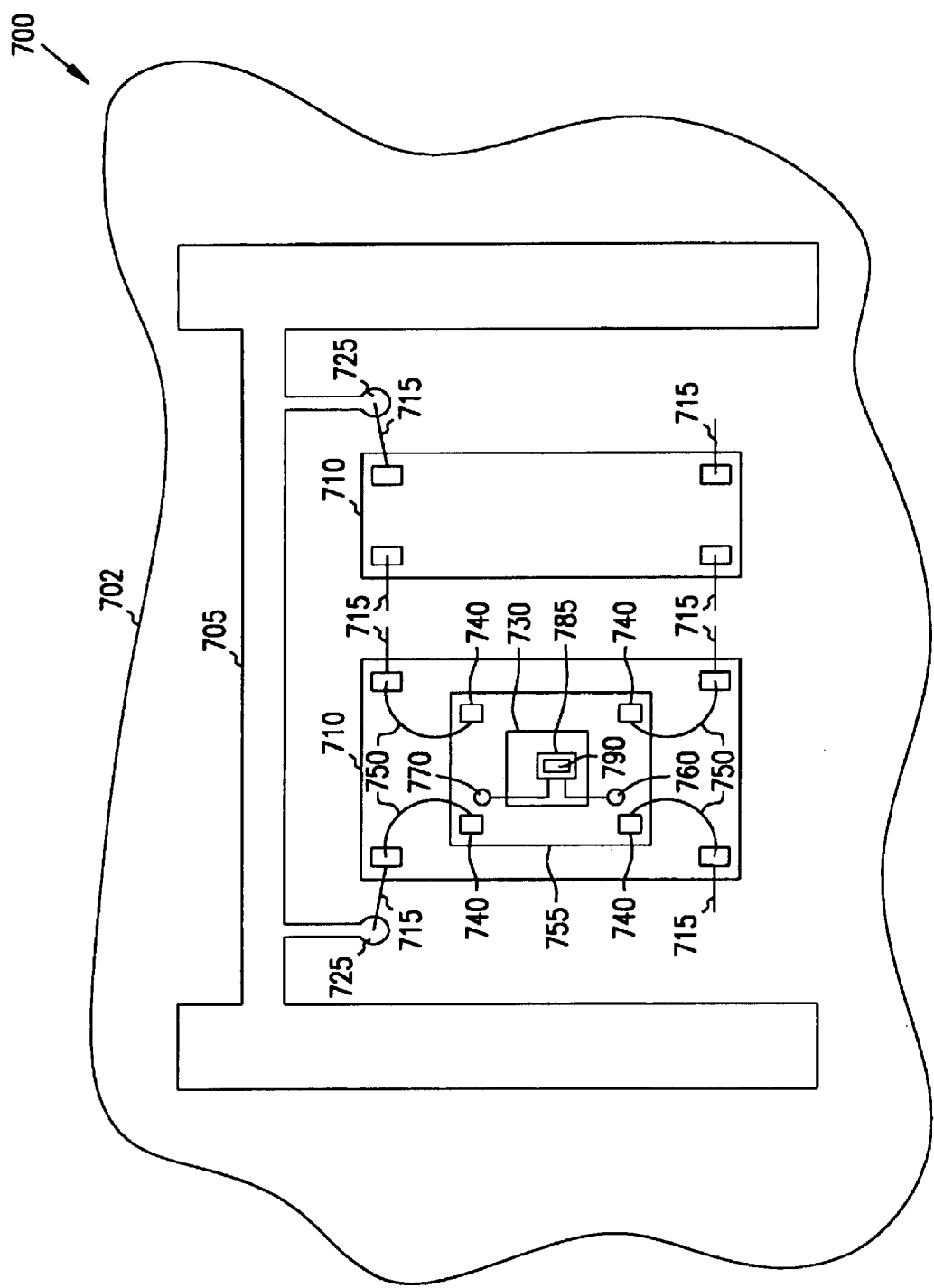
FIG. 7 is a schematic block diagram view of the invention as it might be embodied in a memory circuit module.

Referring now to FIG. 7, a schematic block diagram view of the invention as it might be embodied in a memory circuit module can be seen. Thus, a memory circuit module 700 constructed in accordance with the teachings of the present invention may include a circuit board 702 with a conductive layer 705, such as a one or more conductive circuit traces for surface mounting integrated circuit packages on the circuit board 702. A plurality of memory integrated circuit packages 710 may thus be connected to the conductive layer 705.

In accordance with the teachings of the present invention, at east one of the memory integrated circuit packages 710, in turn, may include a plurality of leads 715, wherein at least one of the leads 715 is connected to the conductive layer 705, using a through-hole via, or surface mounting pad 725, for example. The integrated circuit package includes a substrate 755 which has bonding pads 740 electrically connected to the leads 715 by wire bonds 750, as described above. The substrate 755, in turn, supports an integrated circuit 730 which includes a reference domain 760 and a test domain 770. The integrated circuit 730 may be fabricated apart from, or be fabricated to include the measurement circuit 785, also supported by the substrate 755. Again, the measurement circuit 785 is operatively connected to the reference domain 760 and the test domain 770 to measure the difference between the test and reference voltages developed therein.

As described previously, an analog-to-digital converter 790, digital-to-analog converter 790, peak detector 790, comparison circuit 790, sample and hold circuit 790, and/or a complete data acquisition system 790, as are well known to those skilled in the art, can be used within the measurement circuit 785, formed as part of the integrated circuit 730, or apart from the integrated circuit 730, and supported by the substrate 755 to measure the magnitude and/or wave shape of the voltage Vgnd. Thus, there is no real limit to the number of devices, circuits, or methods which may be used within the measurement circuit 785 to measure the magnitude and/or wave shape of the voltage Vgnd within the memory circuit module 700.

Figure 8:
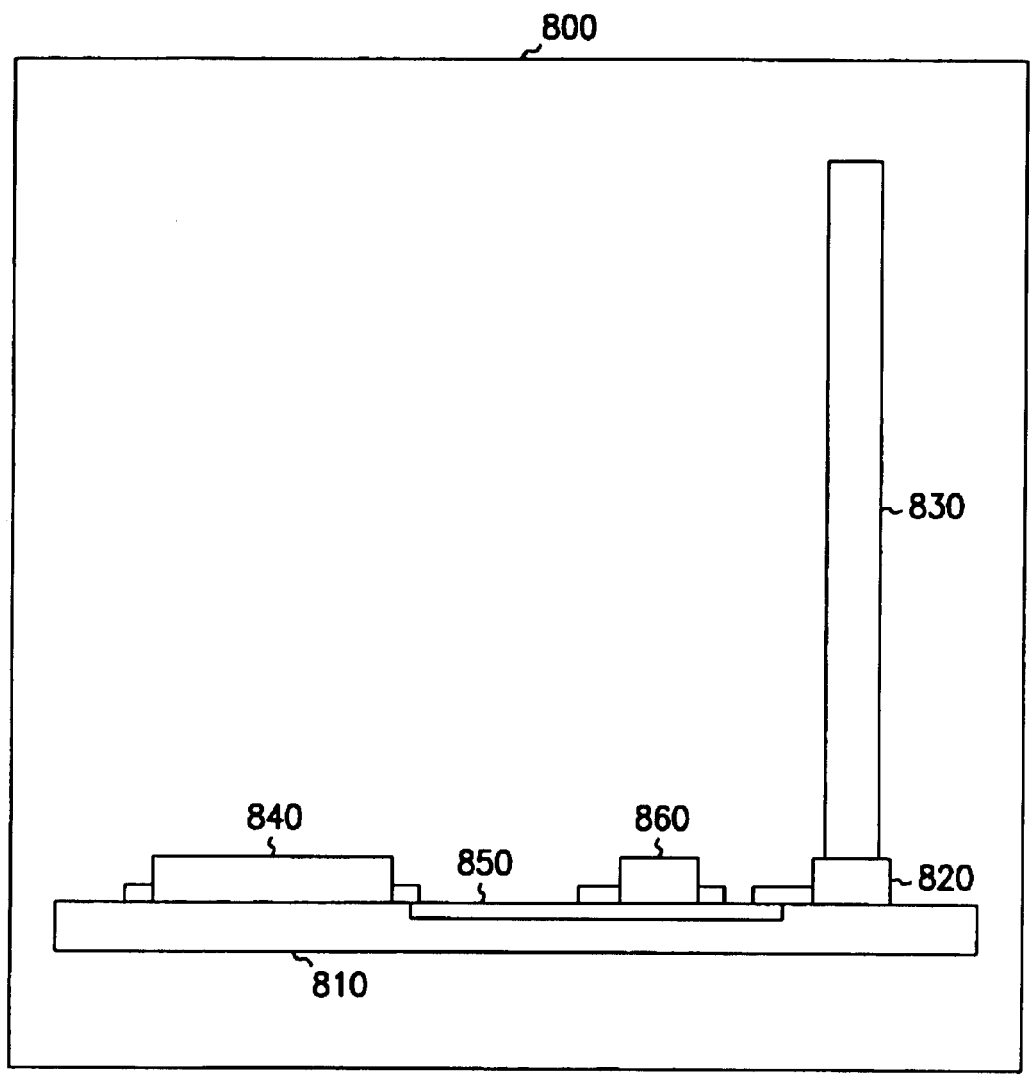
FIG. 8 is a schematic block diagram view of the invention as it might be embodied in a computer system.

Referring now to FIG. 8, a schematic block diagram view of the invention as it might be embodied in a computer system can be seen. Thus, a computer system 800 assembled according to the teachings of the present invention may include a processor circuit card 810 having a memory bus 850, typically constructed using one or more conductive layers formed into the processor circuit card 810. The computer system 800 also includes a memory circuit module 830 connected to the memory bus 850 by way of an edge connector 820. Other memory circuit packages 860, fabricated according to the teachings of the present invention, similar to or identical to the integrated circuit package 500 of FIG. 5, may also be operatively connected to the memory bus 850.

The memory circuit module 830, which is similar to or identical to the memory circuit module 700 illustrated in FIG. 7, may thus include a circuit board with a conductive layer for mounting a plurality of memory integrated circuit packages. In accordance with the teachings of the present invention, at least one of the memory integrated circuit packages may include a plurality of leads, at least one of which is connected to the conductive layer. As described above, the memory integrated circuit package also includes a substrate having pads that are connected to the leads by wire bonds. The substrate in turn supports an integrated circuit which includes test and reference domains. As before, the integrated circuit may be fabricated apart from, or be fabricated to include, the measurement circuit. As per the prior discussion, the measurement circuit is operatively connected to the reference and test domains to measure the ground bounce voltage as the difference between the test and reference voltages developed therein.

Figure 9:
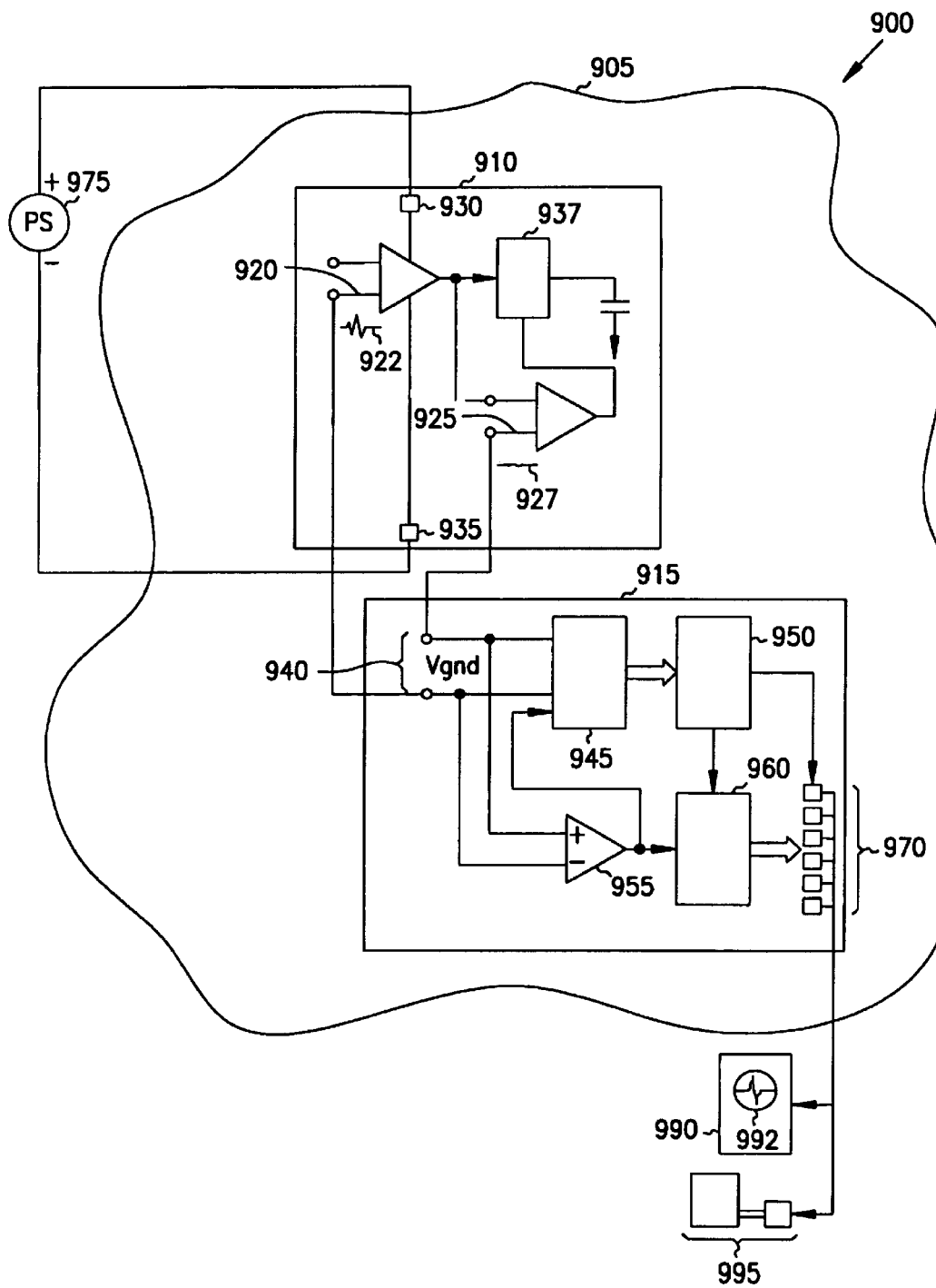
FIG. 9 is a schematic block diagram view of the invention as it might be embodied in a ground bounce measurement system.

Referring now to FIG. 9, a schematic block diagram view of the invention as it might be embodied in a ground bounce measurement system can be seen. Thus, a ground bounce measurement system 900 constructed according to the teachings of the present invention may include a substrate 905 which supports an integrated circuit 910, along with a measurement circuit 915. The integrated circuit 910 may include any number of common circuits known to those skilled in the art, such as a memory array, a central processing unit, other digital circuitry, a digital-to-analog converter, and/or other mixed-signal circuitry, wherein the designer or user would like to characterize the ground bounce voltage during various operational scenarios.

The integrated circuit 910, supported by the substrate 905, includes a test domain 920 and a reference domain 925. When power is applied to the supply pins 930 and 935, which may represent a positive supply pin 930 and a negative supply pin 935, or a ground pin 935, using the power supply 975 for example, a test voltage 922 develops in the test domain 920, and a reference voltage 927 develops in the reference domain 925. As noted previously, the test domain may constitute one of several internal ground or power references where it is important to determine the magnitude of the ground bounce effect, and the reference domain may be a relatively "quiet" ground connection within the integrated circuit which could not normally be accessed by a user of the integrated circuit 910. As the circuit 910 operates, the test voltage 922 and the reference voltage 927 will fluctuate, and the difference between them, or the ground bounce voltage Vgnd, will be developed across the input 940 to the measurement circuit 915.

The methods described above for operating the integrated circuit 910 to obtain measurements of the ground bounce voltage Vgnd may be adapted for use with the ground bounce measurement system 900. As described previously, the first method involves the application of operational power, using the power supply 975 for example, to the supply terminals 930, 935 of the integrated circuit 910, and allowing the circuit 910 to operate in the ordinary fashion. That is, over some selected period of time, the circuit 910 is employed in the typical manner, with whatever loading due to external connections might occur as experienced during the normal course of operation. As noted above, this method of measuring Vgnd is most useful with regard to characterizing the performance of a product having a fixed design.

The second method of measuring the voltage Vgnd using the ground bounce measurement system 900 involves the application of power, using the power supply 975, to the supply terminals 930, 935 of the integrated circuit 910, and operating the circuit 910 in some predetermined manner. As noted above, if the integrated circuit 910 is a microprocessor, the predetermined course of activity may include executing a fixed number of memory write or peripheral access operations during the testing time period. If the integrated circuit 910 is a memory, then the predetermined course of activity may include executing a specified number of memory read operations during the testing time period. Thus, the integrated circuit 910 may be formed to include one or more switching logic circuits 937 which can be exercised, or toggled through various states, in order to provide a predetermined loading to the integrated circuit 910 for testing the behavior of the voltage Vgnd under various operational conditions. In each case, the second testing mode makes use of a selected set of operations which are undertaken by the integrated circuit so that the instantaneous, serial, or continuous value of Vgnd can be readily and repeatedly measured for comparison to some absolute standard. As noted previously, this second method is most useful when some ultimate level of performance is desired for the integrated circuit 910, and the Vgnd measurement is made by the ground bounce measurement system 900 to determine whether that performance level has indeed been reached.

Also, as noted above, after the voltage difference Vgnd is presented to the measurement circuit input 940, measurement and processing include several possibilities. The measurement circuit 915 may include a comparison circuit 945, which provides a differential value to an analog-to-digital converter 950. The resulting digital signal value may then be presented directly to one or more output terminals 970 so as to be accessed by the operator of an oscilloscope 990, or a computer terminal 995. If the Vgnd measurement is captured by an oscilloscope 990, for example, the waveform may be immediately seen on a display device 992, such as a cathode ray tube, or a solid-state, flat panel display.

Alternatively, the measurement system 900 and measurement circuit 915 may include an analog-to-digital converter 945 which feeds into a digital-to-analog converter 950. Then, the resulting analog signal can be sent directly to one or more output terminals 970 for access by the operator of the oscilloscope 990, or the computer terminal 995. In either case, the user of the ground bounce measurement system 900 constructed and operated in accordance with the teachings of the present invention obtains the primary advantage noted previously, namely, the voltage Vgnd can be measured without the parasitic inductance and capacitance introduced by prior art methods involving integrated circuit packages and external probes. External measurement equipment can also be more completely isolated from the measurement apparatus (e.g., due to the isolation provided by the analog-to-digital converter and digital-to-analog converter pair 945, 950), if desired.

As noted above, a peak detector 955, whose output is sent to an analog-to-digital converter 945, directly to the outputs 970, and/or even to a data acquisition system 960, may also be included as part of measurement circuit 915. Thus, one or more values for Vgnd measured by the measurement circuit 915 may be presented continuously at the outputs 970, or acquired by the data acquisition system 960 for later readout by the attached devices 990 (e.g., oscilloscope) and/or a computer terminal 995.

As described previously, an analog-to-digital converter 945, digital-to-analog converter 950, peak detector 955, comparison circuit 945, sample and hold circuit 960, and/or a complete data acquisition system 960, as are well known to those skilled in the art can be used within the measurement circuit 915, formed as part of the integrated circuit 910, or apart from the integrated circuit 910, and supported by the substrate 905 to measure the magnitude and/or wave shape of the voltage Vgnd. Thus, there is no real limit to the number of devices, circuits, or methods which may be used within the measurement circuit 915 to measure the magnitude and/or wave shape of the voltage Vgnd connected to the input 940 of the measurement circuit 915.

It will be understood by those of ordinary skill in the art that the embodiments shown in FIGS. 4–9 illustrate circuit packaging, modules, circuits, and systems in which the novel ground bounce measurement circuitry of the present invention, having an integrated circuit operationally coupled to a (ground bounce voltage) measurement circuit, and supported by the same substrate, or being carried within the same integrated circuit package, is included. Thus, one of ordinary skill in the art will understand upon reading this description that the ground bounce measurement circuitry of the present invention can be used in applications other than for memory modules, circuit cards, integrated circuit packages, measurement systems, computer systems, and various other forms of circuitry and systems, and thus, the invention is not to be so limited. The illustrations of a semiconductor die 400 in FIG. 4, an integrated circuit package 500 in FIG. 5, a circuit board 600 in FIG. 6, a memory circuit module 700 in FIG. 7, a computer system 800 in FIG. 8, and a ground bounce measurement system 900, as shown in FIG. 9, are intended to provide a general understanding of a few of the applications which may be served by the structure and circuitry of the present invention, and are not intended to serve as a complete description of all the elements and features of electronic circuitry, modules, or systems which make use of the novel ground bounce measurement circuitry and structures described herein.

Applications which may include the novel ground bounce measurement circuitry of the present invention as described in this disclosure include electronic circuitry used in high-speed computers, arrays of memory modules and other circuit cards, device drivers, power modules, communication circuitry, modems, processor modules, power supply systems, memory integrated circuits, embedded processors, and application-specific modules, including multilayer, multi-chip modules. Such circuitry may further be included as sub-components within a variety of electronic systems, such as clocks, televisions, cellular telephones, personal computers, printers, automobiles, industrial control systems, aircraft, and others.

FIGS. 4–9 described in detail above are similarly useful in presenting the application of various methods which may be carried out according to the teachings of the present invention. Those of ordinary skill in the art will realize that various elements of the circuits, dice, modules, circuit cards, and systems of the present invention may be assembled and used in accordance with the structures described in the various figures. However, for clarity, several embodiments of methods conducted according to the teachings of the present invention will be specifically illustrated.

Figure 10:
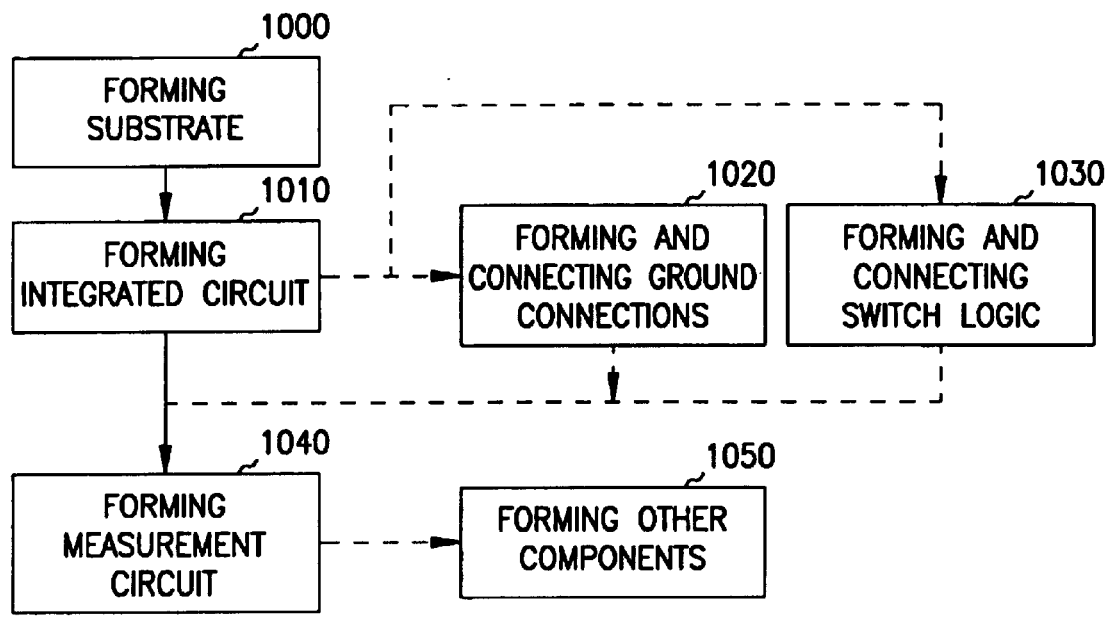
FIG. 10 is a flow chart diagram of a method to form a semiconductor die according to the teachings of the present invention.

For example, referring now to FIG. 10, a flow chart diagram of a method to form a semiconductor die according to the teachings of the present invention can be seen. The method of forming a semiconductor die begins at step 1000 with forming a substrate according to any conventional process well known to those of ordinary skill in the art. The method continues with forming an integrated circuit supported by the substrate in step 1010, again in accordance with a variety of methods well known to those skilled in the art. However, in this case, forming the integrated circuit includes forming a test domain and forming a reference domain, and forming an operative connection such that the desired test and reference voltages will be developed in their respective domains upon the application of operational power to the integrated circuit.

Optionally, and in accord with step 1020, forming the integrated circuit may include forming a first ground connection, including forming a connection from the first ground connection to the test domain, and forming a second ground connection, including forming a connection to the reference domain. For example, as noted previously, the integrated circuit may be constructed so that the test domain is one of several internal ground or power references where measuring the magnitude of the ground bounce voltage is deemed particularly important, and the reference domain is a relatively "quiet" ground connection within the integrated circuit which would not otherwise normally be accessible to users of the integrated circuitry.

In addition, in accordance with optional step 1030, the method shown in FIG. 10 may include forming a switching logic circuit as a part of the integrated circuit and connecting the switching logic circuit to the test domain. This facilitates uniform loading and ground bounce measurement operations as various loads, connected to the switching logic, are switched into and out of the integrated circuit.

The method then concludes with step 1040: forming the measurement circuit supported by the substrate upon which the integrated circuit is also supported, and operatively connecting (i.e. forming an operative connection between) the measurement circuit and the integrated circuit using the test and reference domains, enabling measurement of the voltage difference between them, which is the ground bounce voltage.

Optionally, prior to concluding this method of forming a die, and in accordance with step 1050, other component elements may be formed in the measurement circuit, such as analog-to-digital converters, digital-to-analog converters, peak detectors, comparison circuits, sample and hold circuits, and/or a complete data acquisition system, as are well known to those skilled in the art.

Figure 11:
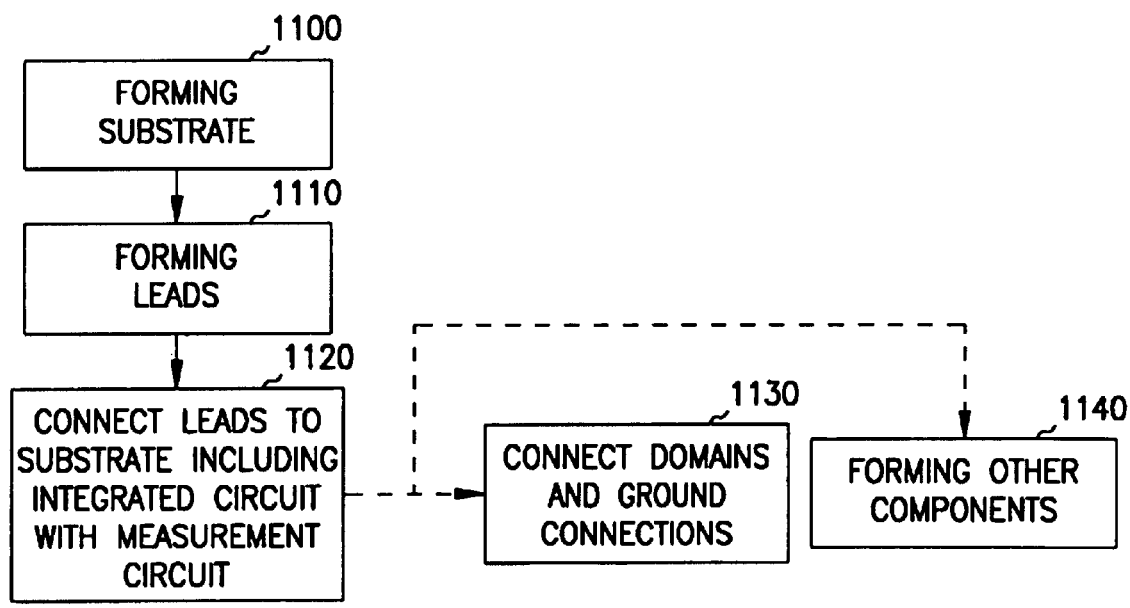
FIG. 11 is a flow chart diagram of a method to form an integrated circuit package according to the teachings of the present invention.

Referring now to FIG. 11, a flow chart diagram of a method to form an integrated circuit package according to the teachings of the present invention can be seen. The method of forming an integrated circuit package begins at step 1100 with forming a substrate according to any conventional process, such as those that are well known to those of ordinary skill in the art. The method continues with forming a plurality of leads in step 1110. The leads so formed are connected to an integrated circuit constructed according to the teachings of the invention (so as to include a test domain and a reference domain, formed and connected such that the desired test and reference voltages will be developed in their respective domains upon the application of operational power to the integrated circuit) in step 1120, typically using a plurality of wire bonds connected to the substrate which supports the integrated circuit. Of course, the integrated circuit is also connected to a measurement circuit (typically supported by the same substrate which supports the integrated circuit), and the measurement circuit, in turn, is operatively connected to the integrated circuit by way of the test and reference domains, such that the voltage difference between them, which is the ground bounce voltage, may be measured.

Optionally, instead of concluding the method of forming an integrated circuit package in step 1120, in accordance with step 1130, the integrated circuit, as an element of the integrated circuit package, may be formed so as to include a first ground connection, which is connected to the test domain, and a second ground connection, which is connected to the reference domain. For example, as noted previously, the integrated circuit may be constructed so that the test domain is one of several internal ground or power references where measuring the magnitude of the ground bounce effect is deemed particularly important, and the reference domain is a relatively "quiet" ground connection within the integrated circuit which would not otherwise normally be accessible to users of the integrated circuit.

In addition, prior to concluding the method of forming an integrated circuit at step 1120, in accordance with optional step 1140, the method shown in FIG. 11 may include forming other component elements in the integrated circuit, such as a processor, memory array, switching logic for test loading, and/or an output driver. Other components may also be formed in the measurement circuit in step 1140, such as analog-to-digital converters, digital-to-analog converters, peak detectors, comparison circuits, sample and hold circuits, and/or a complete data acquisition system, as are well known to those skilled in the art.

Figure 12:
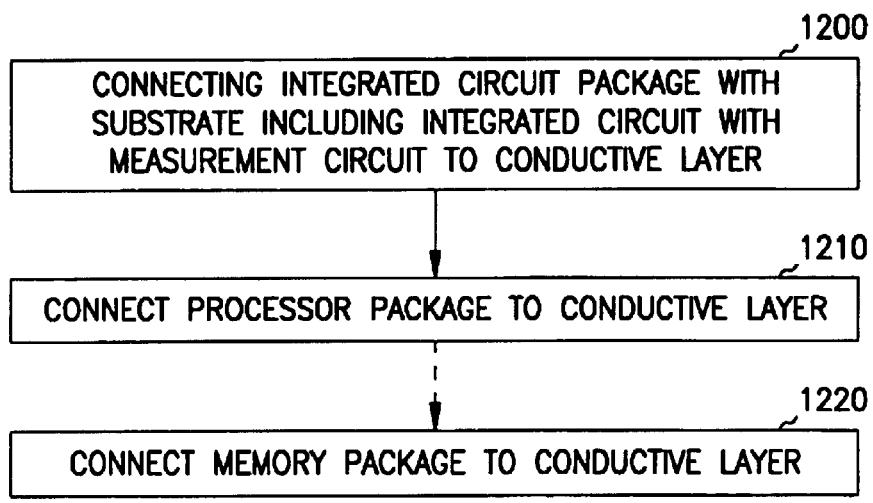
FIG. 12 is a flow chart diagram of a method to assemble a circuit board according to the teachings of the present invention.

Referring now to FIG. 12, a flow chart diagram of a method to assemble a circuit board according to the teachings of the present invention can be seen. The method of assembling a circuit board includes connecting an integrated circuit package to a conductive layer provided by the circuit board in step 1200. The integrated circuit package, constructed according to the teachings of the present invention, typically includes a substrate formed according to any conventional process well known to those skilled in the art. The integrated circuit package also includes a plurality of leads connected to an integrated circuit constructed according to the teachings of the invention (so as to include a test domain and a reference domain, formed and connected such that the desired test and reference voltages will be developed in their respective domains upon the application of operational power to the integrated circuit), using a plurality of wire bonds connected to the substrate which supports the integrated circuit, for example. As has been noted previously, the present invention includes many other packaging schemes besides that of wire bonding, such as flip-chips, tape bonding, etc. Thus, wire bonding is merely to be taken as a well-known and easily understood example, and not as a limitation. In any case, regardless of the type of packaging which is ultimately used, in accordance with the teachings of the present invention the integrated circuit may be connected to a measurement circuit (typically supported by the same substrate which supports the integrated circuit), and the measurement circuit, in turn, may be operatively connected to the integrated circuit using the test and reference domains, such that the voltage difference between them, which is the ground bounce voltage, can be measured.

The method of assembling a circuit board includes connecting a processor circuit package to the conductive layer in step 1210, and may conclude with this step. The method of assembling a circuit board may also continue with optional step 1220: connecting a memory circuit package to the conductive layer. It should be noted that neither the processor circuit package, nor the memory circuit package need be constructed according to the teachings of the present invention.

Figure 13:
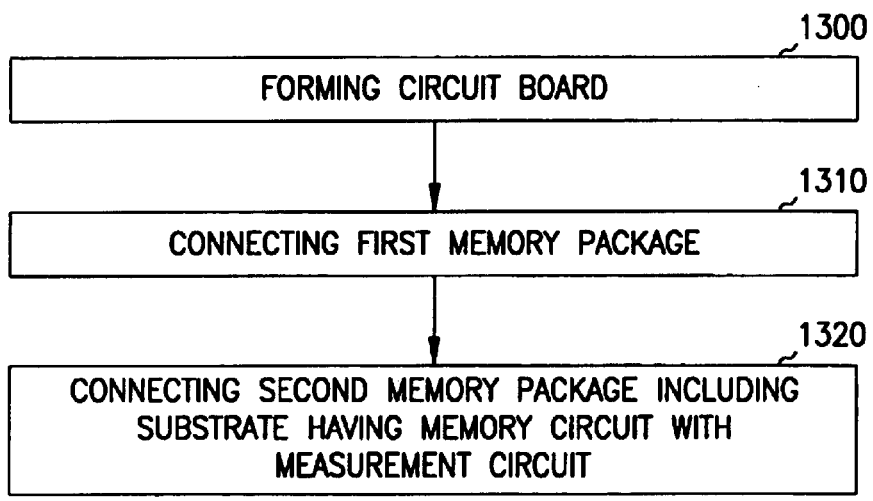
FIG. 13 is a flow chart diagram of a method to assemble a memory circuit module according to the teachings of the present invention.

Referring now to FIG. 13, a flow chart diagram of a method to assemble a memory circuit module according to the teachings of the present invention can be seen. The method begins with forming a circuit board having one or more conductive layers according to any conventional process well known to those skilled in the art in step 1300. The method continues with connecting a first memory integrated circuit package to the conductive layer in step 1310. It should be noted that the memory integrated circuit packages can be soldered directly to the circuit card, mounted in socketed carriers, or attached to the circuit card in any number of ways well known to those skilled in the art.

The method then continues, and concludes, with step 1320, which involves connecting a second memory integrated circuit package to the conductive layer of the circuit card. The second memory integrated circuit package is constructed according to the teachings of the present invention, and includes a substrate formed according to any conventional process well known to those skilled in the art. The second memory integrated circuit package also includes a plurality of leads connected to an integrated circuit constructed according to the teachings of the invention (so as to include a test domain and a reference domain, formed and connected such that the desired test and reference voltages will be developed in their respective domains upon the application of operational power to the integrated circuit), using a plurality of wire bonds connected to the substrate which supports the integrated circuit, for example. The integrated circuit is connected to a measurement circuit (typically supported by the same substrate which supports the integrated circuit), and the measurement circuit, in turn, is operatively connected to the integrated circuit using the test and reference domains, such that the voltage difference between them, which is the ground bounce voltage, may be measured.

Figure 14:
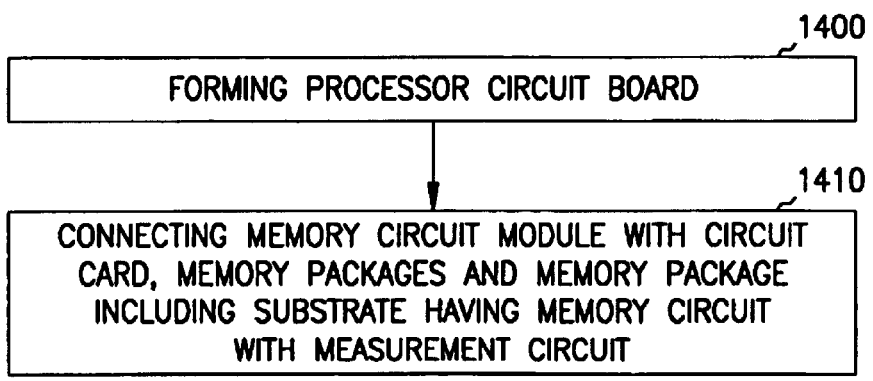
FIG. 14 is a flow chart diagram of a method to assemble a computer system according to the teachings of the present invention.

Referring now to FIG. 14, a flow chart diagram of a method to assemble a computer system according to the teachings of the present invention can be seen. The method of assembling a computer system begins with forming a processor circuit card including a memory bus, typically using a series of conductive traces, according to any conventional process well known to those skilled in the art in step 1400.

The method of assembling a computer system continues with connecting a memory circuit module to the memory bus, using any number of sockets or carriers, such as those made to mount single in-line memory modules (SIMMS) or dual in-line memory modules (DIMMS), in step 1410. The memory circuit module so connected is constructed according to the teachings of the present invention, and includes at least one memory integrated circuit package connected to the conductive layer of the memory module circuit card. The memory integrated circuit package is also constructed according to the teachings of the present invention, and includes a substrate formed according to any conventional process well known to those skilled in the art. In addition, the memory integrated circuit package includes a plurality of leads connected to an integrated circuit constructed according to the teachings of the invention (so as to include a test domain and a reference domain, formed and connected such that the desired test and reference voltages will be developed in their respective domains upon the application of operational power to the integrated circuit), using a plurality of wire bonds connected to the substrate which supports the integrated circuit, for example. The integrated circuit is connected to a measurement circuit (typically supported by the same substrate which supports the integrated circuit), which is in turn operatively connected to the integrated circuit using the test and reference domains, such that the voltage difference between them, which is the ground bounce voltage, may be measured.

Figure 15:
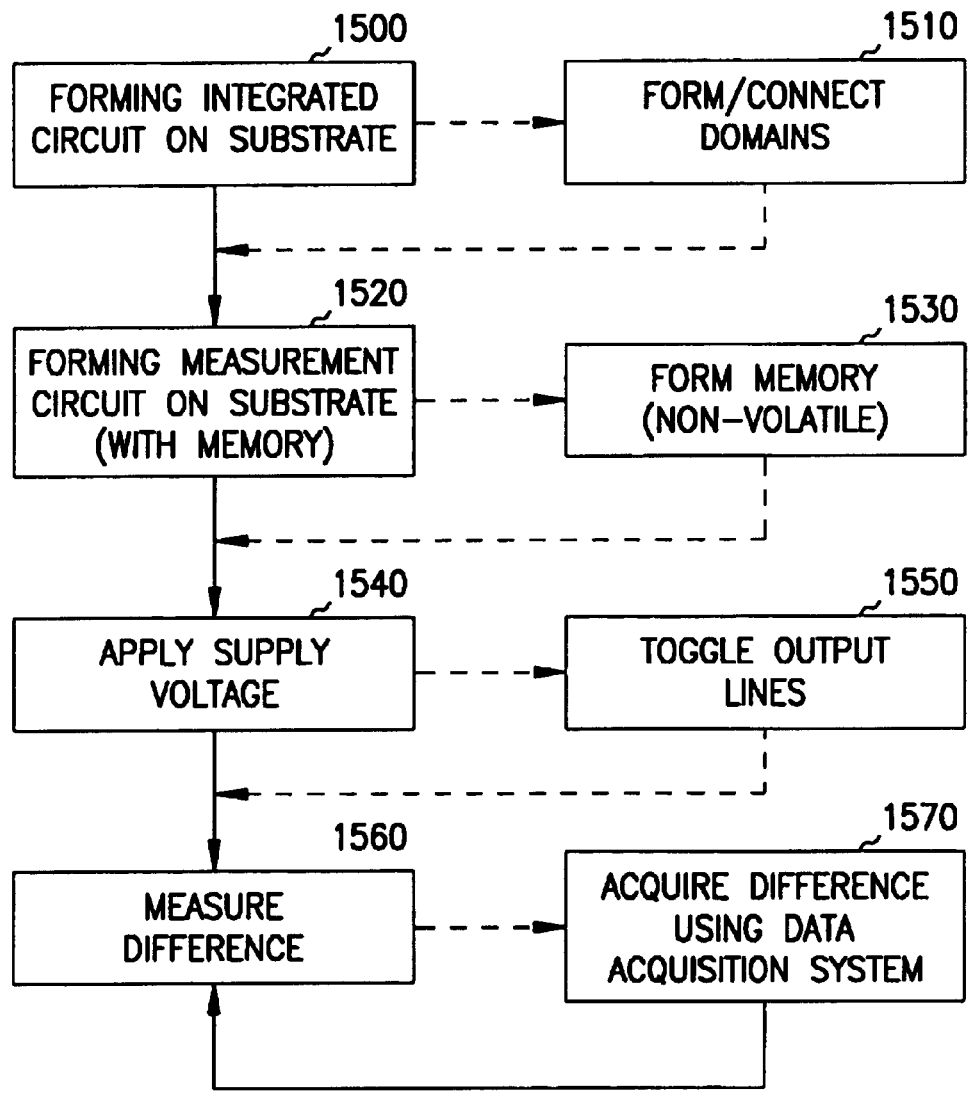
FIG. 15 is a flow chart diagram of a method to measure one or more ground bounce voltage values according to the teachings of the present invention.

Referring now to FIG. 15, a flow chart diagram of a method to measure one or more ground bounce voltage values according to the teachings of the present invention can be seen. The method of measuring one or more ground bounce voltage values for an integrated circuit begins with step 1500: forming an integrated circuit on a substrate, such that the integrated circuit includes reference and test domains in which respective test and reference voltages are developed after the application of operational power.

Optionally, instead of continuing the method with step 1520, in accordance with step 1510, the integrated circuit may be formed so as to include a first ground connection, which is connected to the test domain, and a second ground connection, which is connected to the reference domain. For example, as noted previously, the integrated circuit may be constructed so that the test domain is one of several internal ground or power references where measuring the magnitude of the ground bounce effect is deemed particularly important, and the reference domain is a relatively "quiet" ground connection within the integrated circuit which would not otherwise normally be accessible to users of the integrated circuit.

The method then continues with step 1520: forming the measurement circuit supported by the substrate upon which the integrated circuit is also supported, such that the measurement circuit is operatively connected to the integrated circuit using the test and reference domains, so that the voltage difference between them, which is the ground bounce voltage, may be measured.

Optionally, prior to continuing the method with step 1540, and in accordance with step 1530, other component elements may be formed into the measurement circuit, such as an analog-to-digital converter, a digital-to-analog converter, a peak detector, a comparison circuit, a sample and hold circuit, and/or a complete data acquisition system, as are well known to those skilled in the art.

The method continues with applying operational power to the integrated circuit in step 1540, and measuring the difference in voltage between the test and reference domains (i.e., measuring the ground bounce voltage) in step 1560. Optionally, if the integrated circuit is formed with a plurality of output lines, the output lines may be toggled (in a manner similar to or identical to that described for the output lines 370 of the flip-flop 310 illustrated in prior art FIG. 3) in some sequence to provide a known loading pattern for the integrated circuit. More preferably, a switching logic test loading circuit, including a fixed load, is formed as an element of the integrated circuit, and switched in some predetermined manner to provide a well-characterized load with known effects on the ground bounce voltage measurement.

As mentioned briefly above, the ground bounce measurement circuitry of the present invention may be formed as two separate circuits supported by the same substrate: an integrated circuit, which is to be characterized by measuring the ground bounce voltage as the difference between two domains, and the measurement circuit itself. These circuits may also be constructed according to the teachings of the inventions such that the measurement circuit is formed as an element of the integrated circuit, even to the degree of sharing some of the same components. This could be accomplished by using a digital-to-analog converter that is part of the integrated circuit to serve double duty: as a typical converter for external data acquisition, and in a ground bounce voltage measurement acquisition mode, for example.

CONCLUSION

Thus, the present invention provides novel ground bounce measurement circuitry, circuit packages, memory modules, circuit cards, and systems. According to the teachings of the invention, methods are also disclosed to form, assemble, and use such circuitry, circuit packages, memory modules, circuit cards, and systems. The invention obviates the need for specialized ground bounce measurement equipment, greatly simplifying the testing and measurement process. The invention also greatly improves the accuracy of, and contributes uniformity to, ground bounce measurements, since heretofore inaccessible domains within a circuit can now be used to take desired measurements internally, with the results available as needed, unaffected by the presence of the measurement instrumentation itself.

Although specific embodiments have been illustrated and described herein, it will be appreciated by those of ordinary skill in the art that any arrangement which is calculated to achieve the same purpose may be substituted for the specific embodiment shown. This application is intended to cover any and all adaptations or variations of the present invention. It is to be understood that the above description has been made in an illustrative fashion, and not a restrictive one. Combinations of the above embodiments, and other embodiments not specifically described herein will be apparent to those of skill in the art upon reviewing the above description. The scope of the invention includes any other applications in which the above structures, circuitry, and fabrication and assembly methods are used. The scope of the invention should be determined with reference to the appended claims, along with the full range of equivalents to which such claims are entitled.

What is claimed is:

1. A semiconductor die, comprising:
   a substrate;
   an integrated circuit supported by the substrate, wherein the integrated circuit includes a test domain having a test voltage and a reference domain having a reference voltage; and
   a measurement circuit supported by the substrate, wherein the measurement circuit is operatively connected to the reference domain and the test domain to measure a difference between the test voltage and the reference voltage; wherein the test domain is a first ground connection of the integrated circuit, and wherein the reference domain is a second ground connection of the integrated circuit.

2. The semiconductor die of claim 1, wherein the integrated circuit includes a switching logic circuit connected to the test domain.

3. The semiconductor die of claim 1, wherein the circuit includes a peak detector.

4. The semiconductor die of claim 1, wherein the measurement circuit includes a comparison circuit.

5. A semiconductor die, comprising:

a substrate;

an integrated circuit supported by the substrate, wherein the integrated circuit includes a test domain having a test voltage and a reference domain having a reference voltage; and a measurement circuit including an analog-to-digital converter supported by the substrate, wherein the measurement circuit is operatively connected to the reference domain and the test domain to measure a difference between the test voltage and the reference voltage wherein the test domain is a first ground connection of the integrated circuit, and wherein the reference domain is a second ground connection of the integrated circuit.

6. An integrated circuit package, comprising:

a plurality of leads;

a substrate electrically connected to the plurality of leads by a plurality of wire bonds; and an integrated circuit supported by the substrate, wherein the integrated circuit includes:
  a test domain having a test voltage and a reference domain having a reference voltage; and
  a measurement circuit supported by the substrate, wherein the measurement circuit is operatively connected to the reference domain and the test domain to measure the difference between the test voltage and the reference voltage; wherein the test domain is a first ground connection of the integrated circuit, and wherein the reference domain is a second ground connection of the integrated circuit.

7. The integrated circuit package of claim 6, wherein the integrated circuit includes a processor connected to the test domain.

8. The integrated circuit package of claim 6, wherein the integrated circuit includes a memory array connected to the test domain.

9. The integrated circuit package of claim 6, wherein the integrated circuit includes an output driver connected to the test domain.

10. A circuit board, comprising:

a conductive layer; and an integrated circuit package, comprising:
  a plurality of leads, wherein at least one of the plurality of leads is connected to the conductive layer;
  a substrate electrically connected to the plurality of leads by a plurality of wire bonds; and
  an integrated circuit supported by the substrate, wherein the integrated circuit comprises:
    a test domain having a test voltage and a reference domain having a reference voltage; and
    a measurement circuit supported by the substrate, wherein the measurement circuit is operatively connected to the reference domain and the test domain to measure the difference between the test voltage and the reference voltage; wherein the test domain is a first ground connection of the integrated circuit, and wherein the reference domain is a second ground connection of the integrated circuit.

11. The circuit board of claim 10, wherein the integrated circuit includes a processor connected to the test domain.

12. The circuit board of claim 10, wherein the integrated circuit includes a memory array connected to the test domain.

13. A memory circuit module, comprising:

a circuit board having a conductive layer;

a first memory integrated circuit package connected to the conductive layer; and a second memory integrated circuit package, comprising:
  a plurality of leads, wherein at least one of the plurality of leads is connected to the conductive layer;
  a substrate electrically connected to the plurality of leads by a plurality of wire bonds; and
  an integrated memory circuit supported by the substrate, wherein the integrated memory circuit comprises:
    a test domain having a test voltage and a reference domain having a reference voltage; and
    a measurement circuit supported by the substrate, wherein the measurement circuit is operatively connected to the reference domain and the test domain to measure the difference between the test voltage and the reference voltage.

14. The memory circuit module of claim 13, wherein the measurement circuit includes a peak detector.

15. The memory circuit module of claim 13, wherein the measurement circuit includes an analog-to-digital converter.

16. The memory circuit module of claim 13, wherein the measurement circuit includes a comparison circuit.

17. A computer system, comprising:

a processor circuit card including a memory bus; and a memory circuit module connected to the memory bus, the memory circuit module comprising:
  a circuit board having a conductive layer;
  a first memory integrated circuit package connected to the conductive layer; and
  a second memory integrated circuit package, comprising:
    a plurality of leads, wherein at least one of the plurality of leads is connected to the conductive layer;
    a substrate electrically connected to the plurality of leads by a plurality of wire bonds; and
    an integrated memory circuit supported by the substrate, wherein the integrated memory circuit comprises:
      a test domain having a test voltage and a reference domain having a reference voltage; and
      a measurement circuit supported by the substrate, wherein the measurement circuit is operatively connected to the reference domain and the test domain to measure the difference between the test voltage and the reference voltage.

18. A ground bounce measurement system, comprising:

a substrate;

an integrated circuit supported by the substrate, wherein the integrated circuit includes a test domain having a test voltage and a reference domain having a reference voltage; and a measurement circuit supported by the substrate, wherein the measurement circuit includes a data acquisition system, wherein the measurement circuit is operatively connected to the reference domain and the test domain to measure the difference between the test voltage and the reference voltage, and wherein the difference is acquired and stored by the data acquisition system.

19. The ground bounce measurement system of claim 18, wherein the test domain is a first ground connection of the integrated circuit, and wherein the reference domain is a second ground connection of the integrated circuit.

20. The ground bounce measurement system of claim 18, wherein the measurement circuit includes a peak detector.

21. The ground bounce measurement system of claim 18, wherein the measurement circuit includes an analog-to-digital converter.

22. The ground bounce measurement system of claim 18, wherein the measurement circuit includes a comparison circuit.

23. A ground bounce measurement system, comprising:
   a substrate;
   an integrated circuit supported by the substrate, wherein the integrated circuit includes a test domain having a test voltage and a reference domain having a reference voltage; and
   a measurement circuit supported by the substrate, wherein the measurement circuit includes a data acquisition system, wherein the measurement circuit is operatively connected to the reference domain and the test domain to measure a plurality of differences between the test voltage and the reference voltage, and wherein the plurality of differences is acquired and stored by the data acquisition system.

24. The ground bounce measurement system of claim 23, wherein the measurement circuit includes an analog-to-digital converter.

25. The ground bounce measurement system of claim 23, wherein the measurement circuit includes a comparison circuit.

26. The ground bounce measurement system of claim 23, wherein the measurement circuit includes a digital-to-analog converter.

27. The ground bounce measurement system of claim 23, wherein the plurality of differences are read from the data acquisition system by a computer terminal.

28. A method of forming a semiconductor die, comprising:
   forming an integrated circuit supported by a substrate, wherein forming the integrated circuit includes forming a test domain having a test voltage and forming a reference domain having a reference voltage; and
   forming a measurement circuit supported by the substrate, wherein forming the measurement circuit includes forming a connection to the reference domain and the test domain to enable measuring a difference between the test voltage and the reference voltage wherein the test domain is a first ground connection of the integrated circuit, and wherein the reference domain is a second ground connection of the integrated circuit.

29. The method of claim 28, wherein forming the integrated circuit includes forming a first ground connection and a second ground connection, and further includes:
   connecting the test domain to the first ground connection; and
   connecting the reference domain to the second ground connection.

30. The method of claim 29, wherein the method further includes:
   forming a switching logic circuit as a part of the integrated circuit; and
   connecting the switching logic circuit to the test domain.

31. The method of claim 28, wherein the method further includes forming a comparison circuit in the measurement circuit.

32. The method of claim 28, further including forming an analog-to-digital converter in the measurement circuit.

33. A method of forming an integrated circuit package, comprising:
   forming a substrate;
   forming a plurality of leads; and
   connecting the plurality of leads to an integrated circuit supported by the substrate with a plurality of wire bonds, wherein the integrated circuit includes:
      a test domain having a test voltage and a reference domain having a reference voltage; and
      a measurement circuit supported by the substrate, wherein the measurement circuit is operatively connected to the reference domain and the test domain to measure the difference between the test voltage and the reference voltage wherein the test domain is a first ground connection of the integrated circuit, and wherein the reference domain is a second ground connection of the integrated circuit.

34. The method of claim 33, wherein the integrated circuit includes a first ground connection and a second ground connection, further including:
   connecting the test domain to the first ground connection; and
   connecting the reference domain to the second ground connection.

35. The method of claim 33, further including forming a processor in the integrated circuit, wherein the processor is connected to the test domain.

36. The method of claim 35, further including forming a memory array in the integrated circuit, wherein the memory array is connected to the test domain.

37. The method of claim 36, further including forming an output driver in the integrated circuit, wherein the output driver is connected to the test domain.

38. A method of assembling a circuit board including a conductive layer, comprising:
   connecting an integrated circuit package to the conductive layer, further including forming the integrated circuit package, comprising:
      forming a plurality of leads, wherein at least one of the plurality of leads is connected to the conductive layer;
      forming a substrate electrically connected to the plurality of leads by a plurality of wire bonds; and
      forming an integrated circuit supported by the substrate, wherein forming the integrated circuit comprises:
         forming a test domain having a test voltage and forming a reference domain having a reference voltage; and
         forming a measurement circuit supported by the substrate, wherein forming the measurement circuit includes operatively connecting the measurement circuit to the reference domain and the test domain to enable measuring the difference between the test voltage and the reference voltage; wherein the test domain is a first ground connection of the integrated circuit, and wherein the reference domain is a second ground connection of the integrated circuit, and
   connecting a processor circuit package to the conductive layer.

39. The method of claim 38, further including connecting a memory circuit package to the conductive layer.

40. A method of assembling a memory circuit module, comprising:
   forming a circuit board having a conductive layer;

connecting a first memory integrated circuit package to the conductive layer; and connecting a second memory integrated circuit package to the conductive layer, including forming the second memory integrated circuit package, comprising:

forming a plurality of leads, wherein at least one of the plurality of leads is connected to the conductive layer;

forming a substrate electrically connected to the plurality of leads by a plurality of wire bonds; and forming an integrated memory circuit supported by the substrate, wherein forming the integrated memory circuit comprises:

forming a test domain having a test voltage;

forming a reference domain having a reference voltage; and forming a measurement circuit supported by the substrate, wherein the measurement circuit is operatively connected to the reference domain and the test domain to measure the difference between the test voltage and the reference voltage.

41. A method of assembling a computer system, comprising:

forming a processor circuit card including a memory bus; and connecting a memory circuit module to the memory bus, including forming the memory circuit module, comprising:

forming a circuit board having a conductive layer;

forming a first memory integrated circuit package connected to the conductive layer; and forming a second memory integrated circuit package, comprising:

forming a plurality of leads, wherein at least one of the plurality of leads is connected to the conductive layer;

forming a substrate electrically connected to the plurality of leads by a plurality of wire bonds; and forming an integrated memory circuit supported by the substrate, wherein forming the integrated memory circuit comprises:

forming a test domain having a test voltage;

forming a reference domain having a reference voltage; and forming a measurement circuit supported by the substrate, including forming an operative connection to the reference domain and the test domain to enable measuring the difference between the test voltage and the reference voltage.

42. A method of measuring a ground bounce voltage value of an integrated circuit, comprising:

forming the integrated circuit on a substrate, wherein forming the integrated circuit includes forming a test domain having a test voltage and forming a reference domain having a reference voltage;

applying operational power to the integrated circuit;

measuring a difference between the test voltage and the reference voltage using a measurement circuit on the substrate, wherein the measurement circuit includes a data acquisition system, and wherein the measurement circuit is operatively connected to the reference domain and the test domain to measure the ground bounce voltage value of the integrated circuit as the difference between the test voltage and the reference voltage; and acquiring the difference using the data acquisition system.

43. The method of claim 42, further including:

coupling the test domain to a first ground connection of the integrated circuit; and coupling the reference domain as a second ground connection of the integrated circuit.

44. The method of claim 42, wherein the method further includes toggling at least one of a plurality of output lines coupled to the integrated circuit.

45. A method of measuring a plurality of ground bounce voltage values of an integrated circuit, comprising:

forming the integrated circuit on a substrate, wherein the integrated circuit includes a test domain having a test voltage and a reference domain having a reference voltage;

applying operational power to the integrated circuit;

measuring the difference between the test voltage and the reference voltage using a measurement circuit on the substrate, wherein the measurement circuit includes a data acquisition system, and wherein the measurement circuit is operatively connected to the reference domain and the test domain to measure the plurality of ground bounce voltage values of the integrated circuit as the difference between the test voltage and the reference voltage over a selected period of time;

acquiring the difference by the data acquisition system; and repeating measuring the difference and acquiring the difference a selected number of times.

46. The method of claim 45, wherein the method includes toggling at least one of a plurality of output lines coupled to the integrated circuit.

* * * * *

UNITED STATES PATENT AND TRADEMARK OFFICE
CERTIFICATE OF CORRECTION

PATENT NO.   : 6,968,485 B2
DATED        : November 22, 2005
INVENTOR(S)  : Steve Van Kirk It is certified that error appears in the above-identified patent and that said Letters Patent is hereby corrected as shown below:

Column 10,
Line 37, delete "east" and insert -- least --.

Column 18,
Line 64, after "wherein the" insert -- measurement --.

Column 19,
Line 12, after "reference voltage" insert -- , --.

Column 21,
Line 46, after "reference voltage" insert -- , --.

Column 22,
Line 15, after "voltage" insert -- , --.

Signed and Sealed this

Twenty-eighth Day of February, 2006

JON W. DUDAS
*Director of the United States Patent and Trademark Office*